US009658343B2

(12) United States Patent
Arodzero et al.

(10) Patent No.: US 9,658,343 B2
(45) Date of Patent: *May 23, 2017

(54) SPECTRAL DISCRIMINATION USING WAVELENGTH-SHIFTING FIBER-COUPLED SCINTILLATION DETECTORS

(71) Applicant: American Science and Engineering, Inc., Billerica (MA)

(72) Inventors: Anatoli Arodzero, Billerica, MA (US); Joseph Callerame, Lexington, MA (US); Dan-Christian Dinca, Chelmsford, MA (US); Rajen Sud, Burlington, MA (US); Lee Grodzins, Lexington, MA (US); Martin Rommel, Lexington, MA (US); Peter Rothschild, Newton, MA (US); Jeffrey Schubert, Somerville, MA (US)

(73) Assignee: American Science and Engineering, Inc., Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/050,894

(22) Filed: Feb. 23, 2016

(65) Prior Publication Data

US 2016/0170044 A1    Jun. 16, 2016

Related U.S. Application Data

(62) Division of application No. 13/758,189, filed on Feb. 4, 2013, now Pat. No. 9,285,488.
(Continued)

(51) Int. Cl.
*G01R 1/20* (2006.01)
*G01T 7/00* (2006.01)
(Continued)

(52) U.S. Cl.
CPC .......... *G01T 1/2018* (2013.01); *G01T 1/2006* (2013.01); *H01L 27/14601* (2013.01);
(Continued)

(58) Field of Classification Search
CPC .... G01T 1/00; G01T 1/16; G01T 1/20; G01T 1/2006; G01T 1/201; G01T 1/2018;
(Continued)

(56) References Cited

U.S. PATENT DOCUMENTS 4,259,582 A   3/1981   Albert ........................... 250/402
4,788,436 A   11/1988  Koechner .................. 250/485.1
(Continued)

FOREIGN PATENT DOCUMENTS

EP   0 813 692      8/2002    ............. G01T 1/161
GB   2 482 024 A    1/2012    ............... G01T 3/06
(Continued)

OTHER PUBLICATIONS

European Patent Office, Supplementary Partial European Search Report—Application No. 13749372.2, mailing date of Jun. 30, 2016, 9 pages.
(Continued)

*Primary Examiner* — Anastasia Midkiff
(74) *Attorney, Agent, or Firm* — Novel IP

(57) ABSTRACT

Methods for discriminating among x-ray beams of distinct energy content. A first volume of scintillation medium converts energy of incident penetrating radiation into scintillation light which is extracted from a scintillation light extraction region by a plurality of optical waveguides that convert the scintillation light to light of a longer wavelength. An x-ray beam initially incident upon the first volume of scintillation medium and traversing the first volume is then incident on a second volume of scintillation medium. The first and second scintillation media may be separated by an
(Continued)

absorber or one or more further volumes of scintillation medium, and may also have differential spectral sensitivities. Scintillation light from the first and second scintillation volumes is detected in respective detectors and processed to yield a measure of respective low energy and high-energy components of the incident x-ray beam.

10 Claims, 18 Drawing Sheets

Related U.S. Application Data

(60) Provisional application No. 61/598,521, filed on Feb. 14, 2012, provisional application No. 61/598,576, filed on Feb. 14, 2012, provisional application No. 61/607,066, filed on Mar. 6, 2012.

(51) Int. Cl.

| | | |
|---|---|---|
| *H01L 27/146* | (2006.01) | |
| *H01L 27/144* | (2006.01) | |
| *G01T 1/20* | (2006.01) | |
| G01T 5/08 | (2006.01) | |
| G01T 3/06 | (2006.01) | |

(52) U.S. Cl.
CPC .......... *H01L 27/14658* (2013.01); *G01T 1/20* (2013.01); *G01T 1/2008* (2013.01); *G01T 3/06* (2013.01); *G01T 5/08* (2013.01); *G01T 7/00* (2013.01); *H01L 27/146* (2013.01); *H01L 27/14643* (2013.01)

(58) Field of Classification Search
CPC ......... G01T 1/202; G01T 1/203; G01T 1/208; G01T 1/24; G01T 7/00; H01L 27/14665; H01L 27/14676; H01L 27/14658; H01L 27/14643; H01L 27/14601; H01L 27/146; H01L 27/144; H01L 27/142; H01L 27/14
See application file for complete search history.

(56) References Cited

U.S. PATENT DOCUMENTS

| | | | | |
|---|---|---|---|---|
| 5,281,820 | A | 1/1994 | Groh et al. | 250/368 |
| 5,302,817 | A | 4/1994 | Yokota et al. | 250/214 VT |
| 5,420,959 | A | 5/1995 | Walker et al. | 385/143 |
| 5,550,380 | A | 8/1996 | Sugawara et al. | 250/370.11 |
| 5,764,683 | A | 6/1998 | Swift et al. | 378/57 |
| 5,784,507 | A | 7/1998 | Holm-Kennedy et al. | 385/31 |
| 5,968,425 | A | 10/1999 | Bross et al. | 264/21 |
| 6,078,052 | A | 6/2000 | DiFilippo | 250/367 |
| 6,252,929 | B1 | 6/2001 | Swift et al. | 378/57 |
| 6,333,502 | B1 | 12/2001 | Sumita et al. | 250/366 |
| 6,459,764 | B1 | 10/2002 | Chalmers et al. | 378/88 |
| 6,542,580 | B1 | 4/2003 | Carver et al. | 378/57 |
| 6,859,607 | B2 | 2/2005 | Sugihara | 385/144 |
| 7,067,079 | B2 | 6/2006 | Bross et al. | 264/122 |
| 7,099,434 | B2 | 8/2006 | Adams et al. | 378/57 |
| 7,115,875 | B1 | 10/2006 | Worstell | 250/363.03 |
| 7,326,933 | B2 | 2/2008 | Katagiri et al. | 250/368 |
| 2002/0082492 | A1 | 6/2002 | Grzeszczuk | 600/407 |
| 2004/0104347 | A1 | 6/2004 | Bross et al. | 250/367 |
| 2004/0140431 | A1 | 7/2004 | Schmand et al. | 250/367 |
| 2005/0018814 | A1 | 1/2005 | Kerschner | 378/98.8 |
| 2005/0078793 | A1 | 4/2005 | Ikeda | 378/98.8 |
| 2005/0236577 | A1 | 10/2005 | Katagiri | 250/390.11 |
| 2006/0251211 | A1 | 11/2006 | Grodzins et al. | 378/57 |
| 2007/0029493 | A1 | 2/2007 | Kniss et al. | 250/370.11 |
| 2009/0230925 | A1 | 9/2009 | Nathan | 250/260 |
| 2009/0257555 | A1 | 10/2009 | Chalmers et al. | 378/57 |
| 2009/0274270 | A1 | 11/2009 | Kotowski et al. | 378/57 |
| 2010/0072398 | A1 | 3/2010 | Fruehauf | 250/487.1 |
| 2010/0108859 | A1 | 5/2010 | Andressen | 250/203.2 |
| 2010/0276602 | A1 | 11/2010 | Clothier et al. | 250/362 |
| 2011/0079726 | A1 | 4/2011 | Kusner et al. | 250/369 |
| 2011/0110490 | A1 | 5/2011 | Samant et al. | 378/63 |
| 2011/0215222 | A1 | 9/2011 | Eminoglu et al. | 250/208.1 |
| 2011/0309253 | A1 | 12/2011 | Rothschild | 250/362 |
| 2011/0309257 | A1 | 12/2011 | Menge | 250/368 |
| 2012/0033791 | A1 | 2/2012 | Mastronardi | 378/87 |
| 2012/0061575 | A1 | 3/2012 | Dunleavy et al. | 250/362 |
| 2012/0104265 | A1 | 5/2012 | Workman et al. | 250/366 |
| 2012/0148020 | A1 | 6/2012 | Arroyo, Jr. et al. | 378/57 |
| 2012/0280132 | A1 | 11/2012 | Nakamura et al. | 250/368 |

FOREIGN PATENT DOCUMENTS

| | | | | |
|---|---|---|---|---|
| WO | WO 2005/103759 | 11/2005 | | G01T 1/20 |
| WO | WO 2006/111323 | 10/2006 | | G01T 1/202 |
| WO | WO 2010/129926 | 11/2010 | | G03C 5/16 |
| WO | WO 2011/163108 | 12/2011 | | G01T 7/00 |

OTHER PUBLICATIONS

Beznosko et al., "FNAL-NICADD Extruded Scintillator," FERMILAB-CONF-04-216-E, pp. 1-4 (Sep. 2004).

Case et al., "Wavelength-shifting fiber readout of $LaCl_3$ and $LaBr_3$ scintillators," *Proc. of SPIE*, vol. 5898, UV, X-Ray, and Gamma-Ray Space Instrumentation for Astronomy XIV, pp. 58980K-1-58980K-8 (2005).

Gundiah, "Scintillation properties of $Eu^{2+}$-activated barium fluoroiodide," *Lawrence Berkeley National Laboratory*, pp. 1-10 (Feb. 2011).

Hutchinson et al., "Optical Readout for Imaging Neutron Scintillation Detectors," Engineering Science and Technology Division, *Oak Ridge National Laboratory, Oak Ridge, Tennessee*, 6 pages. (Nov. 2002).

Keizer, "The optimal cosmic ray detector for High-Schools," 21 pages (2011).

Maekawa et al., "Thin Beta-ray Detectors using Plastic Scintillator Combined with Wavelength-shifting Fibers for Surface Contamination Monitoring," *J. Nucl. Sci. Technol.*, vol. 35, No. 12, pp. 886-894 (Dec. 1998).

Moiseev et al., "High-efficiency plastic scintillator detector with wavelength-shifting fiber readout for the GLAST Large Area Telescope," *Nucl. Instrum. Meth. Phys. Res. A*, vol. 583, pp. 372-381 (2007).

Nishikido et al. "X-ray detector made of plastic scintillators and WLS fiber for real-time dose distribution monitoring in interventional radiology," *IEEE Nuclear Science Symposium and Medical Imaging Conference Record (NSS/MIC)*, pp. 1272-1274 (2012).

Pla-Dalmau et al., "Extruded Plastic Scintillator for MINERvA," FERMILAB-CONF-05-506-E, pp. 1298-1300 (2005).

Yoshimura et al., "Plastic scintillator produced by the injection-molding technique," *Nucl. Instr. Meth. Phys. Res. A*, vol. 406, pp. 435-441 (1998).

Jae Yul Ahn, *Authorized officer* Korean Intellectual Property Office, International Search Report—Application No. PCT/US2013/024585, date of mailing Jun. 2, 2013, *along with Written Opinion of the International Searching Authority* (13 pages).

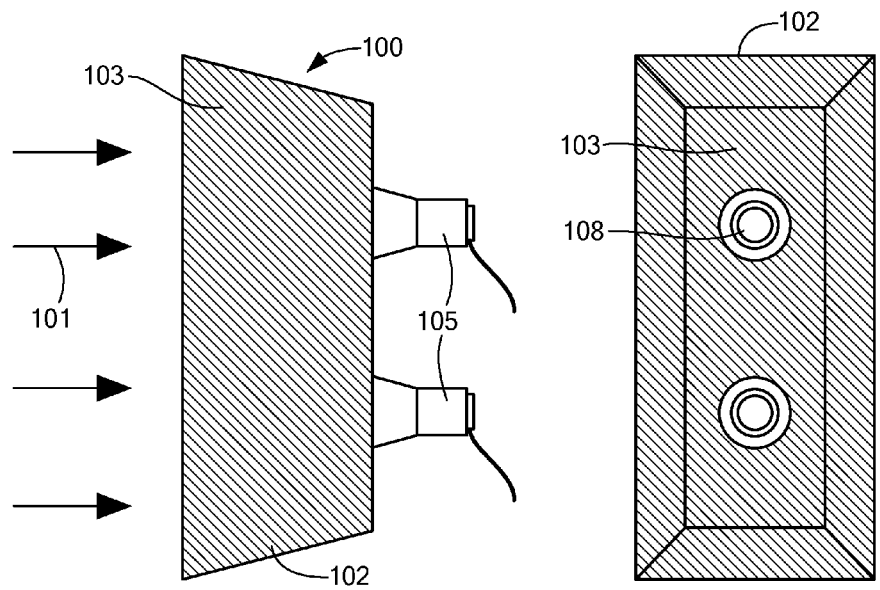
FIG. 1A
PRIOR ART
FIG. 1B
PRIOR ART
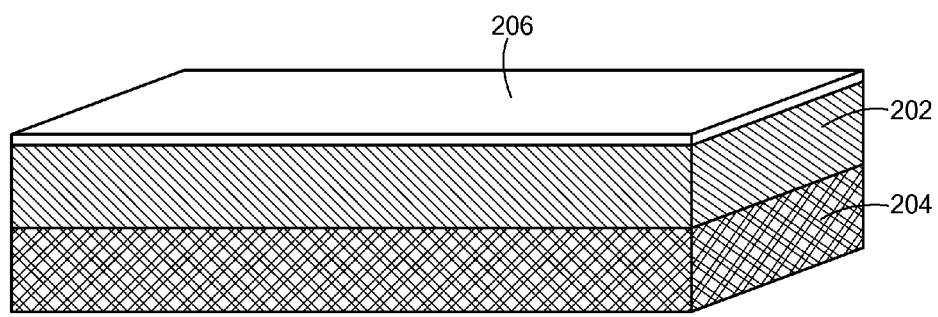
FIG. 2
PRIOR ART

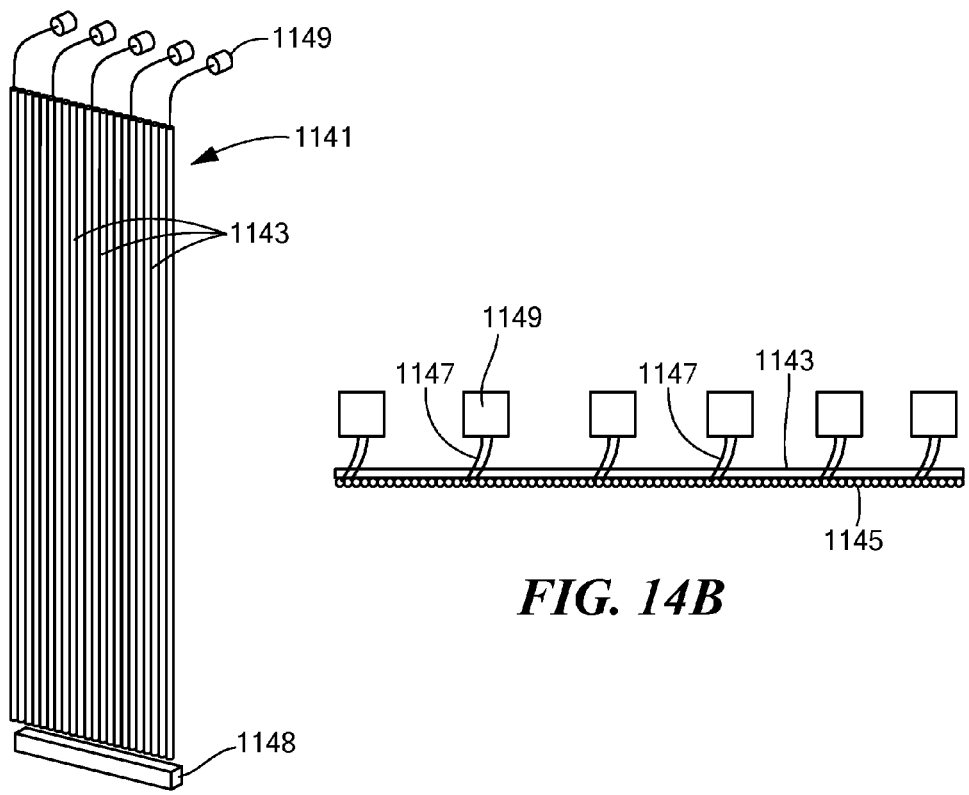
FIG. 14A
FIG. 14B
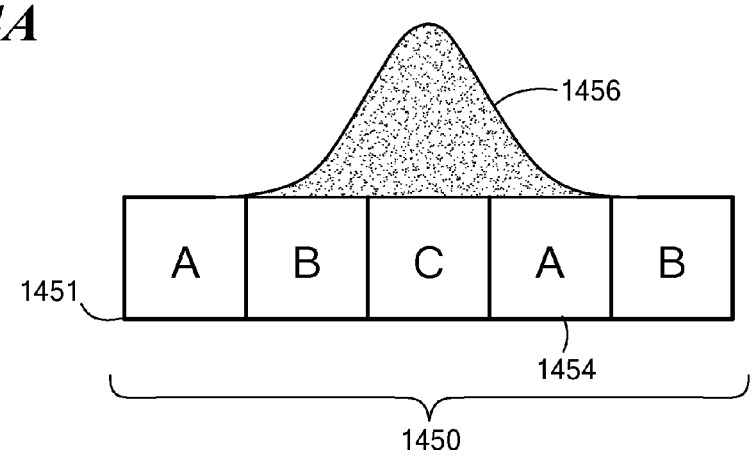
FIG. 14C

SPECTRAL DISCRIMINATION USING WAVELENGTH-SHIFTING FIBER-COUPLED SCINTILLATION DETECTORS

The present application is a divisional application of U.S. Ser. No. 13/758,189, filed Feb. 4, 2013 and now issued as U.S. Pat. No. 9,285,488, and, through that application, claims the priority of U.S. Provisional Patent Applications, Ser. Nos. 61/598,521, and 61/598,576, both filed Feb. 14, 2012, and U.S. Provisional Patent Application, Ser. No. 61/607,066, filed Mar. 6, 2012. All of the aforesaid applications are incorporated by reference herein.

TECHNICAL FIELD

The present invention relates to fiber-coupled scintillation detectors and to methods of their manufacture, and to systems and methods of x-ray inspection employing fiber-coupled scintillation detectors for efficient detection of x-rays.

BACKGROUND ART

Fiber-coupled scintillation detectors of radiation and particles have been employed over the course of the past 30 years. In some cases, the scintillator is pixelated, consisting of discrete scintillator elements, and in other cases, other stratagems are employed (such as orthogonally crossed coupling fibers) in order to provide spatial resolution. Examples of fiber-coupled scintillation detectors are provided by U.S. Pat. No. 6,078,052 (to DiFilippo) and U.S. Pat. No. 7,326,9933 (to Katagiri et al.), both of which are incorporated herein by reference. Detectors described both by DiFilippo and Katagiri et al. employ wavelength-shifting fibers (WSF) such that light reemitted by the core material of the fiber may be conducted, with low attenuation, to photo-detectors disposed at a convenient location, often distant from the scintillator itself. Spatial resolution is of particular value in applications such as neutron imaging. Spatial resolution is also paramount in the Fermi Large Area Space Telescope (formerly, GLAST) where a high-efficiency segmented scintillation detector employs WSF readout for detection of high-energy cosmic rays, as described in Moiseev, et al., *High efficiency plastic scintillator detector with wavelength-shifting fiber readout for the GLAST Large Area Telescope, Nucl. Instr. Meth. Phys. Res. A*, vol. 583, pp. 372-81 (2007), which is incorporated herein by reference.

Because of the contexts in which fiber-coupled scintillator detectors have been employed to date, all known fiber-coupled scintillator detectors have counted pulses produced by individual interactions of particles (photons or massive particles) with the scintillator, thereby allowing the energy deposited by the incident particle to be ascertained based on the cumulative flux of light reemitted by the scintillator.

The detection requirements of x-ray backscatter inspection systems, however, are entirely different from the requirements addressed by existing fiber-coupled scintillation detectors. Backscatter x-ray inspection systems have been used for more than 25 years to detect organic materials concealed inside baggage, cargo containers, in vehicles, and on personnel. Because organic materials in bulk preferentially scatter x-rays (by Compton scattering) rather than absorb them, these materials appear as brighter objects in backscatter images. Insofar as incident x-rays are scattered into all directions, sensitivity far overrides spatial resolution as a requirement, and in most scatter applications, detector spatial resolution is of no concern at all, since resolution is governed by the incident beam rather than by detection.

The specialized detection requirements of large area and high sensitivity posed by x-ray scatter systems are particularly vexing in the case of "conventional" scintillation detectors 100 of the type shown in a side cross-section in FIG. 1A and in a front cross-section in FIG. 1B. An example of such a detector is described in U.S. Pat. No. 5,302,817 (to Yokota), and is incorporated herein by reference. Typically, a light-tight box 102 is lined with scintillating screens 103 where incident x-ray radiation 101 is converted to scintillation light, typically in the UV, visible, or longer wavelength, portions of the electromagnetic (EM) spectrum. Large-photocathode-area photomultiplier tubes (PMTs) 105 are coupled to receive scintillation light via portholes 108. One problem lies in that a fraction of the scintillation light originating within the screen is transmitted from the screen into the enclosed volume. The remaining scintillation light is lost in the screen material. Scintillating screens 103 are designed to maximize the fraction of emitted light, which is tantamount to ensuring a large transmission coefficient T for the interface between screen 103 and the medium (typically air) filling the detector volume. However, in a conventional backscatter detector of the sort depicted in FIGS. 1A and 1B, the scintillation screens 103 should also serve as good reflectors because scintillation light, once emitted into the volume of box 102, typically needs multiple reflections until it reaches a photo-detector 105. So, the reflection coefficient R of the screen surface should also be large, however, since the sum of T and R is constrained to be unity, both T and R cannot be maximized simultaneously, and a compromise must be struck. As a result, the light collection efficiency of the conventional backscatter detector is inherently low, with only a few percent of the generated scintillation light collected into the photo detectors.

For an imaging detector, the photon statistical noise is calculated in terms of the photons absorbed by the detector and used to generate the image. Any photons which pass through the detector without being absorbed, or even those that are absorbed without generating image information, are wasted and do not contribute to reducing noise in the image. Since photons cannot be subdivided, they represent the fundamental quantum level of a system. It is common practice to calculate the statistical noise in terms of the smallest number of quanta used to represent the image anywhere along the imaging chain. The point along the imaging chain where the fewest number of quanta are used to represent the image is called a "quantum sink". The noise level at the quantum sink determines the noise limit of the imaging system. Without increasing the number of information carriers (i.e., quanta) at the quantum sink, the system noise limit cannot be improved. Poor light collection can possibly create a secondary quantum sink, which is to say that it will limit the fraction of incident x-rays resulting in PMT current. Moreover, it will increase image noise. Light collection efficiency can be improved by increasing the sensitive area of the photo-detectors, however, that path to efficiency is costly.

The structure of scintillating screen typically employed in prior art x-ray scintillation detectors is now described with reference to FIG. 2. A layer of composite scintillator 202 is sandwiched between a backer sheet 204 for structural support and a thin, transparent protective film 206 composed of polyester, for example. The composite scintillator consists of typically micron-size inorganic crystals in an organic matrix or resin. The crystals are the actual scintillating material. Barium fluoro-chloride (BaFCl, or "BFC") or gadolinium oxysulfide ($Gd_2O_2S$, or "Gadox") doped with rare earth elements are common choices for these. The stopping power of the screen is determined by the thickness of the composite scintillator layer 202, which is typically measured in milligrams of scintillator crystal per unit area. Because the inorganic scintillators (such as BFC or Gadox) suffer from high self-absorption, the composite scintillator layer has to be kept rather thin in order to extract a good fraction of the scintillation light. This limits the useful stopping power of the screen and makes it suitable only for the detection of x-rays with energies up to around 100 keV.

Therefore, it would be advantageous to have a scintillation detector for x-ray scatter detection applications that provides for more efficient extraction, collection, and detection of scintillation light.

As briefly discussed at the outset above, wavelength-shifting fibers (WSF) have long been employed for scintillation detection. Wavelength shifting fibers consist of a core with relatively high refractive index, surrounded by one or more cladding layers of lower refractive index. The core contains wavelength-shifting material, also referred as dye. Scintillation light which enters the fiber is absorbed by the dye which, in turn, emits light with a longer wavelength. The longer wavelength light is emitted isotropically in the fiber material. Total internal reflection traps a fraction of that light and conducts it over long distances with relatively low loss. This is possible, as described with reference to FIG. 3, because the absorption 304 and emission 302 wavelength ranges of the dye effectively do not overlap so that the wavelength-shifted light is not reabsorbed. The captured fraction is determined by the ratio of the refractive indices at surfaces of the fiber. An additional advantage of WSF is that the wavelength shifting can bring the scintillation light 306 into the sensitive wavelength range of the photo detector (PMT, silicon photomultiplier (SiPM), or Multiple-Pixel Photon-Counter (MPPC), or otherwise).

Scintillator structures have been produced using many manufacturing technologies, including, for example, die-casting, injection molding (as described by Yoshimura et al., *Plastic scintillator produced by the injection-molding technique*, Nucl. Instr. Meth. Phys. Res. A, vol. 406, pp. 435-41 (1998), and extrusion, (as described in U.S. Pat. No. 7,067,079, to Bross, et al.), both of which references are incorporated herein by reference.

SUMMARY OF EMBODIMENTS OF THE INVENTION

In accordance with various embodiments of the present invention, systems and methods are provided that apply fiber-coupled scintillation detectors to problems in backscatter and transmission x-ray inspection.

For convenience of notation, a wavelength-shifted fiber-coupled scintillation detector may be referred to herein as an "Sc-WSF" detector.

In a first embodiment of the present invention, a detector of penetrating radiation is provided that has an unpixelated volume of scintillation medium for converting energy of incident penetrating radiation into scintillation light. The detector has multiple optical waveguides, aligned substantially parallel to each other over a scintillation light extraction region that is contiguous with the unpixelated volume of the scintillation medium, The optical waveguides guide light derived from the scintillation light to a photo-detector for detecting photons guided by the waveguides and for generating a detector signal.

In other embodiments of the present invention, the detector may also have an integrating circuit for integrating the detector signal over a specified duration of time.

In an alternate embodiment of the invention, a detector of penetrating radiation is provided that has a volume of scintillation medium for converting energy of incident penetrating radiation into scintillation light and a plurality of optical waveguides, aligned substantially parallel to each other over a scintillation light extraction region contiguous with the volume of the scintillation medium. The optical waveguides guide light derived from the scintillation light to a photo-detector that generates a detector signal. Finally, an integrating circuit for integrating the detector signal over a specified duration of time.

In further embodiments of the invention, the optical waveguides in the foregoing detectors may be adapted for wavelength shifting of the scintillation light and, more particularly, may be wavelength-shifting optical fibers. The scintillation medium may include a lanthanide-doped barium mixed halide such as barium fluorochloride. The photo-detector may include a photomultiplier.

In yet further embodiments of the invention, the square of the thickness of any of the foregoing detectors, divided by the area of the detector, may be less than 0.001. At least one of the plurality of waveguides may lacks cladding and the scintillation medium may be characterized by an index of refraction of lower value than an index of refraction characterizing the waveguide. The optical waveguides may be disposed in multiple parallel planes, each of the parallel planes containing a subset of the plurality of optical waveguides.

In other embodiments of the invention, the detector may have a plurality of layers of scintillator medium successively encountered by an incident beam, and the layers may be characterized by distinct spectral sensitivities to the incident beam. Alternating layers of scintillator may include $Li^6F$:ZnS(Ag) alternating with at least one of fiber-coupled BaFCl (Eu) and fiber-coupled BaFI(Eu). A first of the plurality of layers of scintillator medium may be a wavelength-shifting fiber-coupled detector preferentially sensitive to lower-energy x-rays, and a last of the plurality of layers of scintillator medium may be a plastic scintillator.

Segments of scintillator medium may be disposed in a plane transverse to a propagation direction of an incident beam, and may be distinctly coupled to photo-detectors via optical fibers.

In accordance with another aspect of the present invention, a method for manufacturing a scintillation detector, the method comprising extruding a shell of scintillating material around an optical waveguide, and, in a particular embodiment, the optical waveguide is a wavelength-shifting optical fiber.

In an alternate embodiment, a method for detecting scattered x-ray radiation has steps of:
 a. providing a detector characterized by a plurality of individually read-out segments; and
 b. summing a signal from a subset of the individually read-out segments, wherein the subset is selected on a basis of relative signal-to-noise.

In another aspect of the invention, a method is provided for detecting scattered x-ray radiation. The method has steps of:
 a. providing a detector characterized by a plurality of individually read-out segments; and b. summing a signal from a subset of the individually read-out segments, wherein the subset is selected on a basis of a known position of a primary illuminating beam.

A mobile x-ray inspection system is provided in accordance with another embodiment. The inspection system has a source of x-ray radiation disposed upon a conveyance having a platform and ground-contacting members, and a fiber-coupled scintillation detector deployed outside the conveyance during inspection operation for detecting x-rays that have interacted with the inspected object.

The mobile x-ray inspection system may also have a fiber-coupled scintillation awning detector deployed above the inspected object during a course of inspection, and the awning detector may slide out from a roof of the conveyance prior to inspection operation. There may also be a skirt detector deployed beneath the platform of the conveyance, and a roof detector for detection of spaces higher than the conveyance, as well as substantially horizontal and substantially upright fiber-coupled scintillator detector segments. The substantially horizontal and substantially upright fiber-coupled scintillator detector segments may be formed into an integral structure.

In accordance with another aspect of the present invention, an apparatus is provided for detecting radiation incident upon the apparatus, the apparatus comprising:
a. a plurality of substantially parallel active collimation vanes comprising wavelength-shifted fiber-coupled scintillation detectors sensitive to the radiation for generating at least a first detection signal;
b. a rear broad area detector for detecting radiation that passes between substantially parallel active collimation vanes of the plurality of active collimator vanes and generating a second detection signal; and
c. a processor for receiving and processing the first and second detection signals.

In accordance with an alternate embodiment of the invention, a top-down imaging inspection system is provided for inspecting an object disposed on an underlying surface. The top-down imaging inspection system has a source of substantially downward pointing x-rays and a linear detector array disposed within a protrusion above the underlying surface. The linear detector array may include wavelength-shifted fiber-coupled scintillation detectors.

In accordance with another aspect of the invention, an x-ray inspection system is provided for inspecting an underside of a vehicle. The x-ray inspection system has a source of substantially upward pointing x-rays coupled to a chassis and a wavelength-shifting fiber-coupled scintillator detector disposed on the chassis for detecting x-rays scattered by the vehicle and by objects concealed under or within the vehicle. The chassis may be adapted to be maneuvered under the vehicle by at least one of motor and manual control.

BRIEF DESCRIPTION OF THE FIGURES

The foregoing features of the invention will be more readily understood by reference to the following detailed description, taken with reference to the accompanying figures, in which:

FIGS. 1A and 1B show side and front cross-sectional views, respectively, of a "box-type" prior art scintillation detector.

FIG. 2 is a schematic view of a prior art scintillator screen.

FIG. 9 shows roof and skirt backscatter detectors, stowed in accordance with embodiments of the present invention, while

FIGS. 13A and 13B show a layered transmission detector inside a 2-inch-high speed bump, in accordance with an embodiment of the present invention, while

FIG. 14A shows a perspective view of a segmented x-ray transmission detector for measurement of the distribution of detected intensity across the width of an x-ray beam, in accordance with an embodiment of the present invention, while FIGS. 14B and 14C show an end-on cross-section and a typical beam profile of the detector of FIG. 14A.

DETAILED DESCRIPTION OF EMBODIMENTS OF THE INVENTION

In accordance with embodiments of the present invention, the optical coupling of scintillator material to optical waveguides, and, more particularly, to wavelength-shifting fibers, advantageously enables objectives including those peculiar to the demands of x-ray scatter detection.

DEFINITIONS

The term "image" shall refer to any unidimensional or multidimensional representation, whether in tangible or otherwise perceptible form, or otherwise, whereby a value of some characteristic (such as fractional transmitted intensity through a column of an inspected object traversed by an incident beam, in the case of x-ray transmission imaging) is associated with each of a plurality of locations (or, vectors in a Euclidean space, typically $\mathcal{R}^2$) corresponding to dimensional coordinates of an object in physical space, though not necessarily mapped one-to-one thereonto. An image may comprise an array of numbers in a computer memory or holographic medium. Similarly, "imaging" refers to the rendering of a stated physical characteristic in terms of one or more images.

Terms of spatial relation, such as "above," "below," "upper," "lower," and the like, may be used herein for ease of description to describe the relationship of one element to another as shown in the figures. It will be understood that such terms of spatial relation are intended to encompass different orientations of the apparatus in use or operation in addition to the orientation described and/or depicted in the figures.

Where an element is described as being "on," "connected to," or "coupled to" another element, it may be directly on, connected or coupled to the other element, or, alternatively, one or more intervening elements may be present, unless otherwise specified.

The terminology used herein is for the purpose of describing particular embodiments and is not intended to be limiting. The singular forms "a," "an," and "the," are intended to include the plural forms as well.

WSF Detectors

Figure 3:
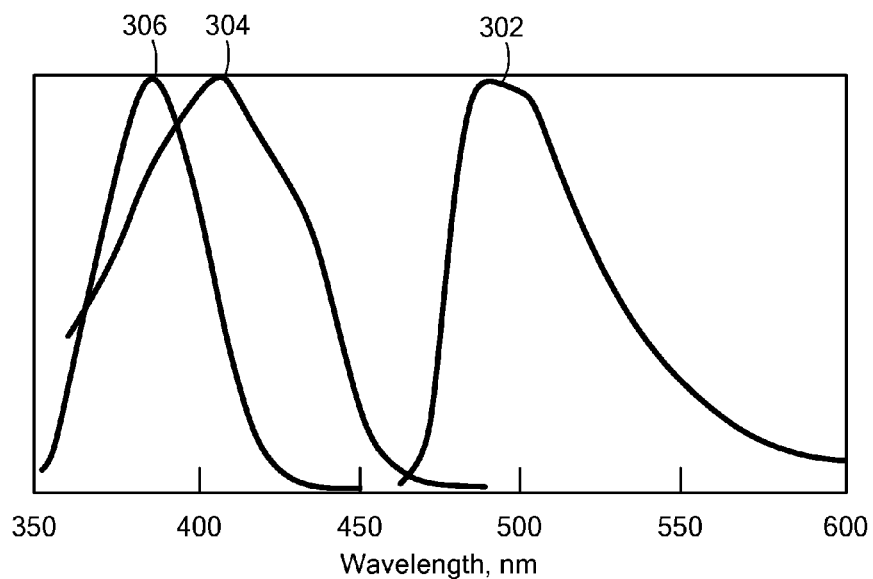
FIG. 3 depicts spectral relationships among scintillation light and typical wavelength-shifting fiber absorption and emission spectra.
Figure 4:
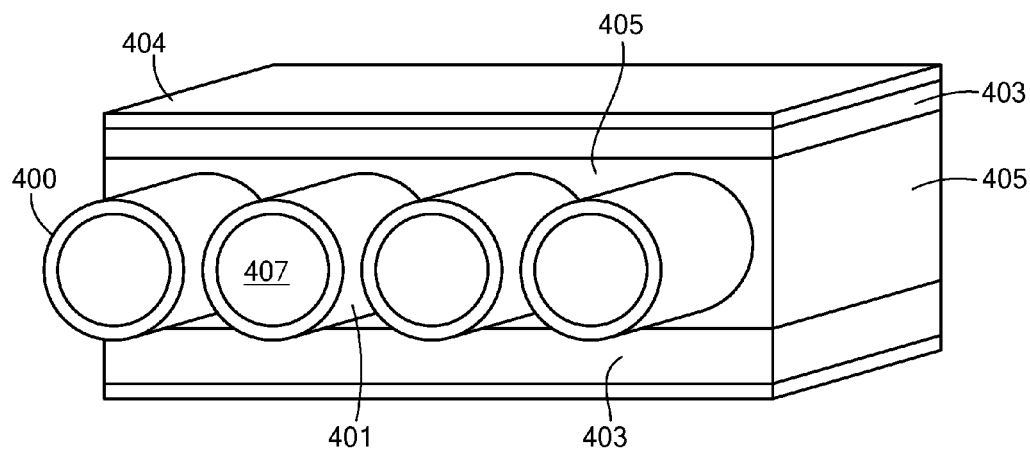
FIG. 4 is a perspective schematic view of an array of wavelength-shifting fibers sandwiched between scintillator material, in accordance with an embodiment of the present invention.

Referring, first, to FIG. 4, in one embodiment of the invention, a layer of closely spaced parallel wavelength-shifting fibers 400 is sandwiched between two layers 403 of composite scintillating screen. The preferred scintillator material is europium-doped barium fluorochloride (BaFCl:Eu), although other scintillators, such as BaFI:Eu, or other lanthanide-doped barium mixed halides (including, by way of further example, BaBrI:Eu and BaCsI:Eu), may be used within the scope of the present invention. Since scintillator materials employed for x-ray detection typically exhibit very strong self-absorption of scintillation photons, embodiments in accordance with the present invention advantageously allow unusually large volumes of scintillator 403 to be employed while still efficiently coupling out scintillation signal.

One advantage to using composite scintillation screen in the present application is that it allows for fabrication by extrusion of a fiber-coupled scintillation detector.

Composite scintillator 403 is structurally supported by exterior layers 404 of plastic, or other material, providing mechanical support. Optical contact between the fiber cladding 401 and the composite scintillator 403 is established by filling the voids with index-matching material 405 of suitable refractive index which is transparent to the scintillation light. The refractive index of the filling material is chosen to optimize the collection of primary light photons into the WSF and the capture of wavelength-shifted photons in the fiber. Filling material 405 may be optical grease or optical epoxy, for example, though any material is within the scope of the present invention.

Figure 8:
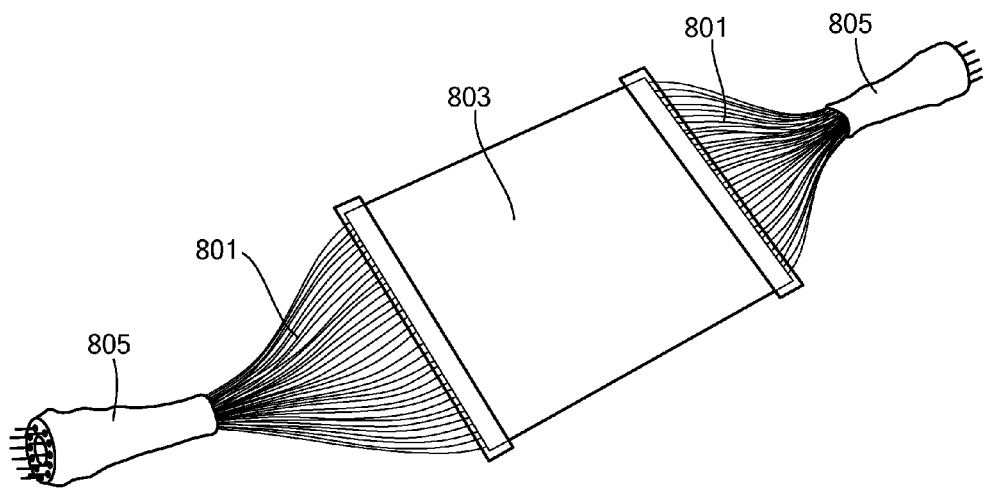
FIG. 8 is a top view of a wavelength-shifted fiber-coupled scintillation detector in accordance with an embodiment of the present invention.

Upon incidence of x-ray photons, scintillation light emitted by scintillator 403 is coupled via cladding 401 into core 407 of the respective fibers, down-shifted in frequency (i.e., red-shifted) and propagated to one or more photo-detectors 805 (shown in FIG. 8, for example). Light from the fiber cores 407 is converted into a current via photo-detector 805, and the current is integrated for an interval of time, typically in the range of 1-12 µs, to obtain the signal strength for each pixel. Integration of the detector signal may be performed by an integrating circuit (not shown), such as an integrating pre-amplifier, for example.

Figure 5:
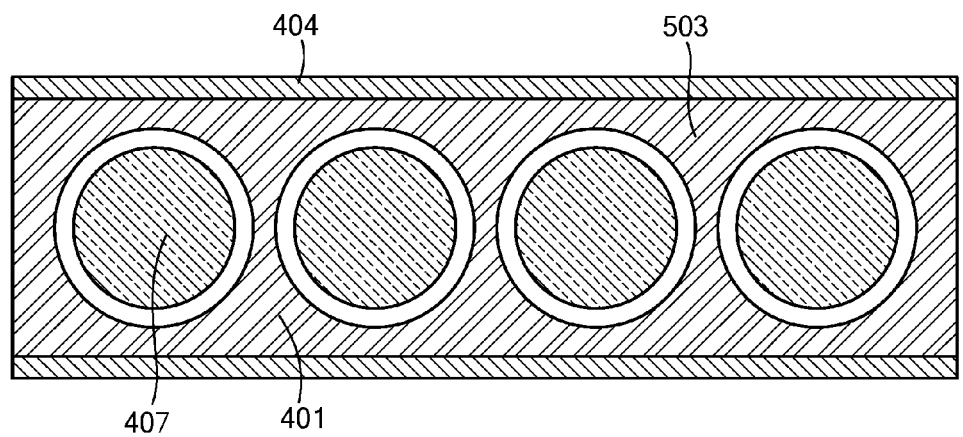
FIG. 5 is a cross-sectional schematic view of an array of wavelength-shifting fibers embedded within a matrix of scintillator material, in accordance with an embodiment of the present invention.

Referring now to FIG. 5, wavelength-shifting fibers 400 are embedded in the matrix of the scintillating screen 503. Embedding the WSF into the scintillating medium creates the best optical contact.

Figure 6A:
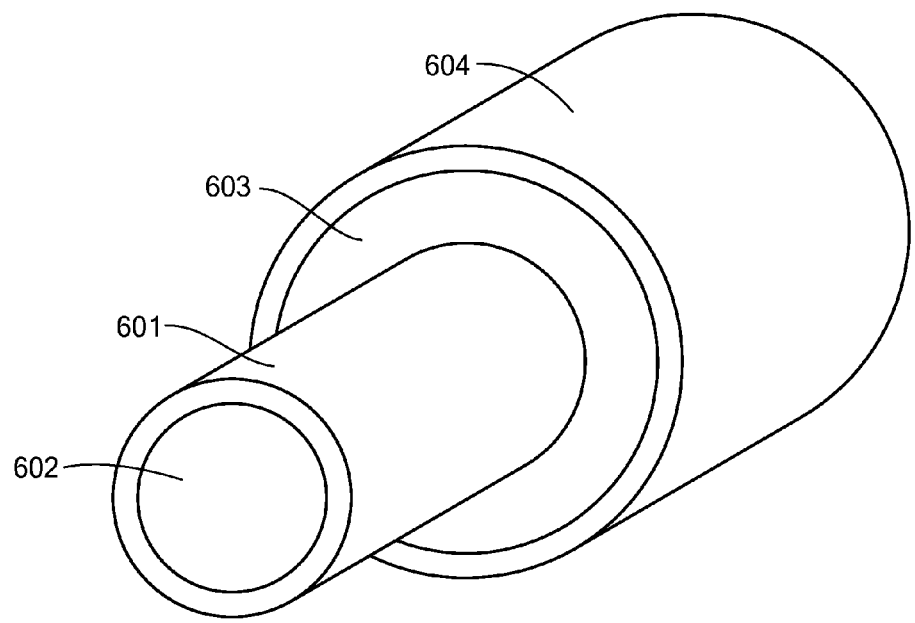
FIG. 6A is a perspective view of a cylindrical scintillator extruded about a WSF, in accordance with an embodiment of the present invention.

In yet another embodiment of the invention, described now with reference to FIG. 6A, composite scintillator material 603 is applied like a cladding or shell around a WSF 601 with core 602. This application lends itself to an extrusion-style manufacturing process and allows making the most effective use of costly scintillator material 603. The scintillator material 603 is sealed off with a protective layer 604 which also acts as a reflector to the scintillation light. Within the scope of the present invention, the cladding may be omitted when the scintillator has a lower index of refraction than the fiber and the scintillator-fiber bond has the necessary smoothness and robustness.

Figure 6B:
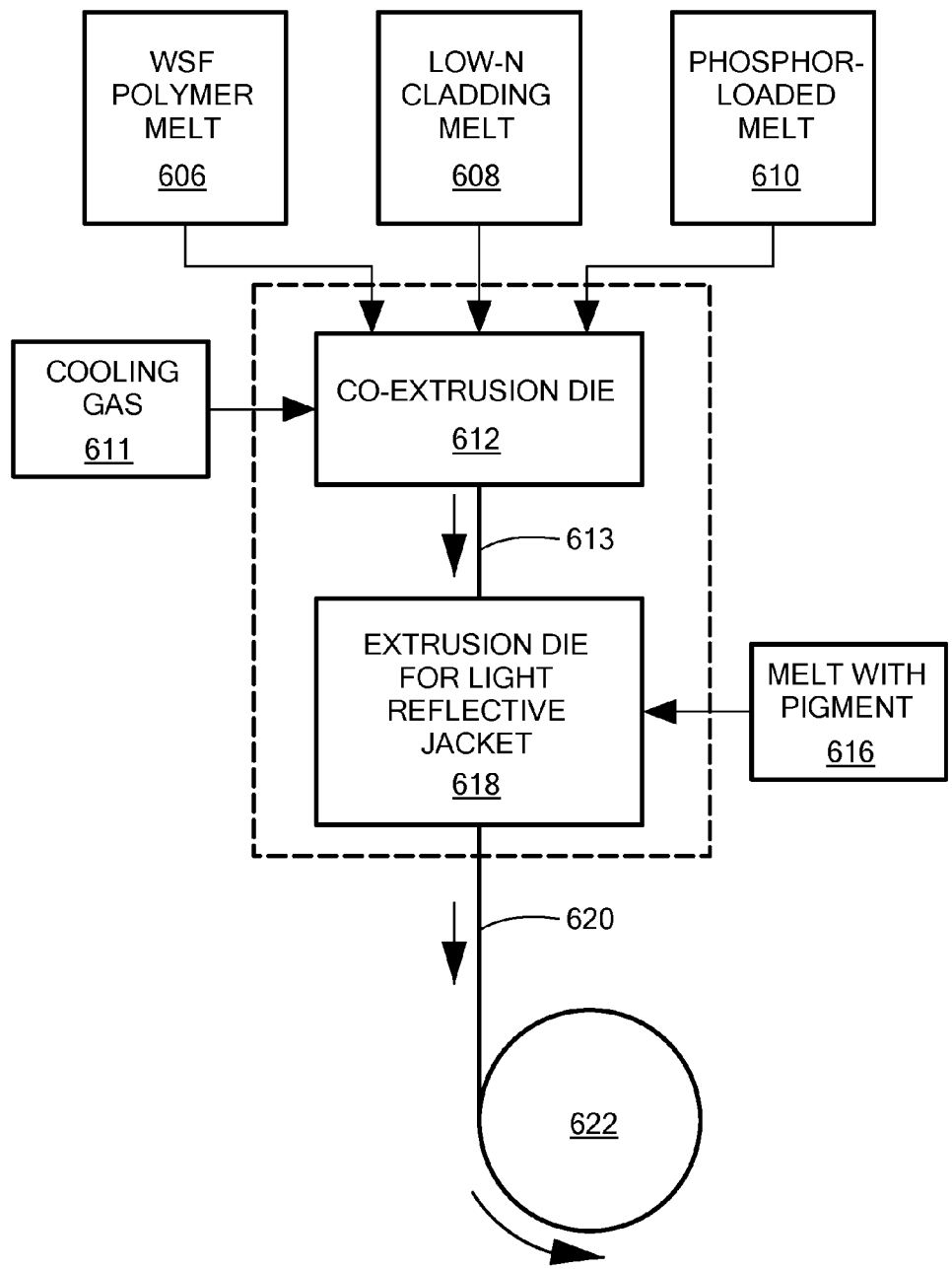
FIG. 6B is a schematic depiction of a system for extruding a cylindrical scintillator about a WSF, in accordance with an embodiment of the present invention.
Figure 6C:
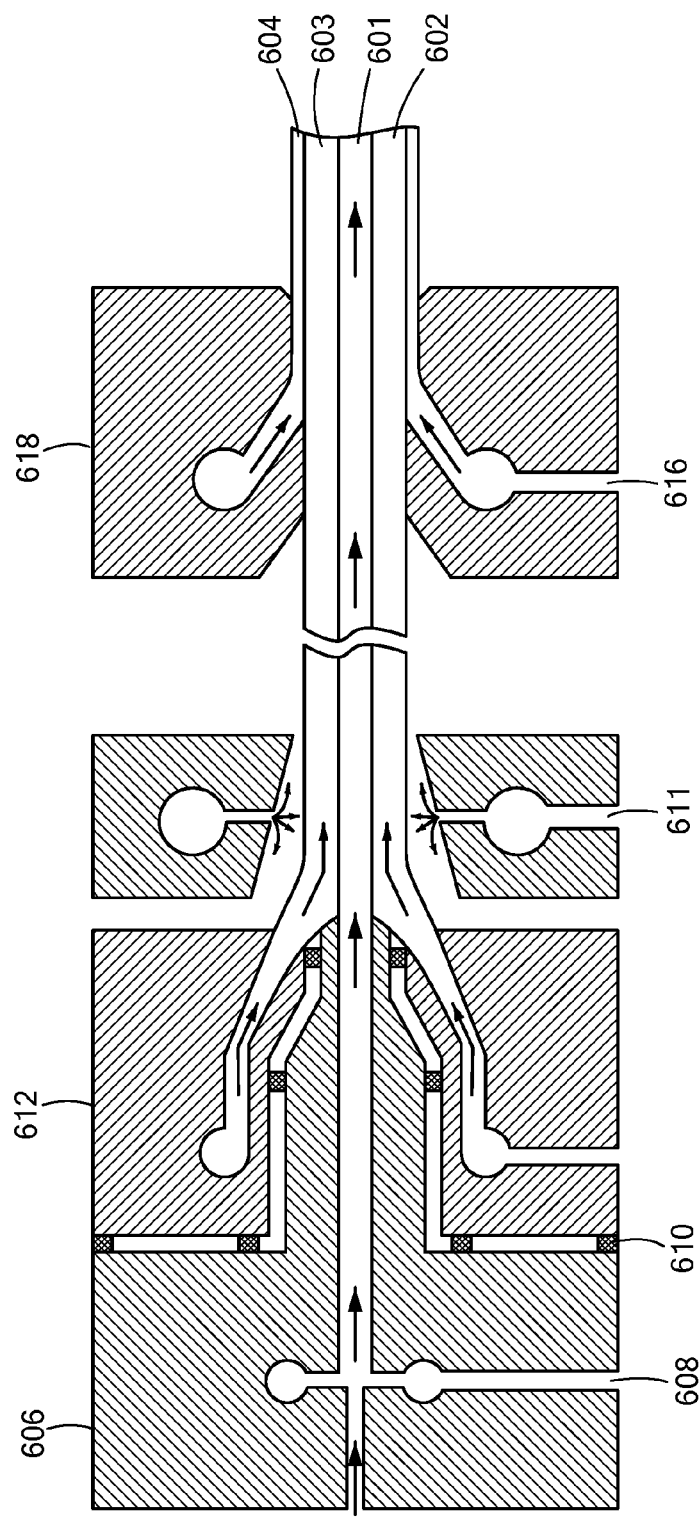
FIG. 6C is a cross-sectional view of an extruder for co-extruding a cylindrical scintillator with a WSF, in accordance with an embodiment of the present invention.

A wavelength-shifting polymer optical fiber may be manufactured, in accordance with an embodiment of the invention now described with reference to the system schematic depicted in FIG. 6B. Sources of WSF polymer melt 606, low-refractive-index cladding polymer melt 608, and phosphor-embedded optically transparent polymer melt 610, all under pressure, are fed into a co-extrusion die 612 within extrusion zone 614, and co-extruded. Dry gas 611, such as dry air or nitrogen, for example, is sprayed onto the extruded fiber for cooling. Polymer melt with a light-reflective pigment (such as $TiO_2$, for example) 616 is fed under pressure into an extrusion die 618 for a light-reflective jacket over the scintillator-coated WSF 613. The resultant scintillator-loaded WSF 620 is wound for storage by winder 622. FIG. 6C shows a cross-sectional view of a co-extrusion system, for use in accordance with embodiments of the present invention, for the manufacture of scintillator-coated WSF. The WSF polymer melt 606 is injected, along with the low-refractive-index cladding polymer melt 608 and phosphor-embedded optically transparent polymer melt 610, into co-extrusion die 612. Polymer melt with a light-reflective pigment 616 is fed under pressure into extrusion die 618. The completed fiber has a WSF core 602, a low-index cladding 601, a scintillator-loaded cladding 603, and a reflective coating 604.

For all embodiments of a scintillation detector in accordance with the present invention, it is advantageous that the thickness of the scintillator material be optimized for the energy of the radiation to be detected. The design should ensure sufficient light collection to avoid a secondary quantum sink. In particular, embodiments of the invention described herein provide for detectors of extraordinary thinness relative to their area.

Definitions:

For purposes of the present description, and in any appended claims, the term "thickness," as applied to a scintillation detector, shall represent the mean extent of the detector in a dimension along, or parallel to, a centroid of the field of view of the detector. The term area, as applied to a detector, or, equivalently, the term "active area" shall refer to the size of the detector measured in a plane transverse to centroid of all propagation vectors of radiation within the field of view of the detector.

Embodiments of the present invention, even those with as many as 8 WSF layers, have ratios of the square of detector thickness to the active detector area that are less than 0.001. For example, an 8-layer detector with an area of 48"×12" has a thickness no greater than 0.5", such that the ratio of the square of the thickness to the detector area is 0.0005. This thickness-squared-to-area ratio is typically an order of magnitude, or more, smaller than the comparable ratio for backscatter detectors where scintillator light is directly detected by a photo-detector.

Figure 7:
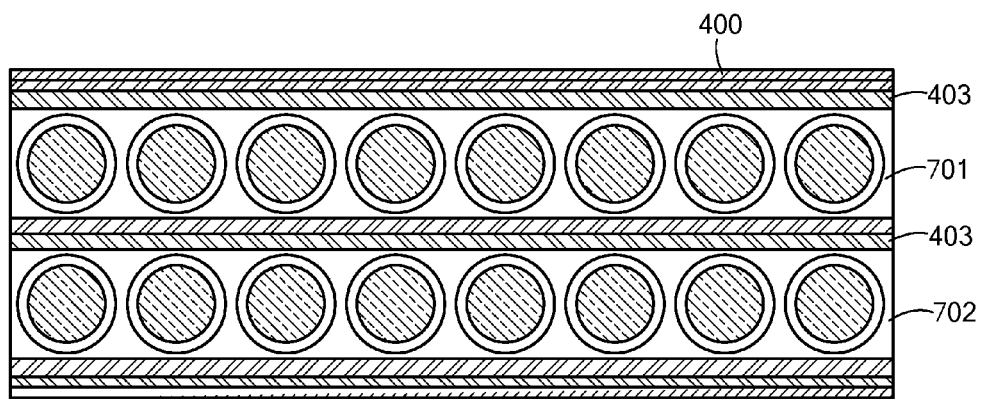
FIG. 7 is a schematic cross-section of a scintillation detector with multiple rows of WSF, in accordance with an embodiment of the present invention.

In accordance with a further embodiment of the invention depicted in FIG. 7, the useful stopping power of the detector can be increased by combining multiple layers 701, 702 of WSF 400 (or other optical waveguides thereby increasing the depth of scintillator material 403 along the path of the incident radiation.

An embodiment of a wavelength-shifted scintillator detector in accordance with the present invention is shown in FIG. 8. Wavelength-shifting fibers 801 are embedded within scintillator material 803, coupling light, and downshifting it in frequency for detection by photomultiplier tubes 805.

In accordance with various of the embodiments heretofore described, the ends of the WSF are bundled and optically coupled to at least one photo detector. Examples of suitable photo detectors include PMTs and silicon photomultipliers (SiPMs).

Advantages of the detector, the invention of which is described herein, include the efficiency of detection, and the low geometrical profile of implementation. This allows greater freedom in designing a detection system and it makes entirely new, space constrained applications possible. The mechanical flexibility of the detector structure allows shaping the detector surface to conform to the application, such as an implementation in which an imaged object is surrounded by detector volume. The low profile also makes it relatively easy to orient and shield the detector area in ways to minimize the detection of unwanted scatter radiation (crosstalk) from a nearby x-ray imaging system.

The extraction of scintillation light over a large region of scintillator enables detectors of large width-to-depth aspect ratio. In particular, detectors subtending spatial angles of 0.1 sr, of more, are facilitated by embodiments of the present invention.

In a typical backscatter x-ray imaging system, an x-ray pencil beam scans an imaged target in a linear motion, while elongated radiation detectors are arranged on both sides of an exit aperture of an x-ray source. As the pencil beam moves, the detector area closest to the beam will typically receive the strongest signal and detector area further from the beam less. If the detector area is segmented into individually readable sections the signal to noise ratio of the detection system can be improved by only reading the segments with a good signal to noise ratio and neglecting the segments which would contribute predominantly noise to the summed signal. The selection of contributing detector segments can be made based on the actually detected signal or based on the known position of the pencil beam.

Advantages of Scintillator Fabrication by Extrusion

The extrusion, or "automated coating" process, described above with reference to FIGS. 6A-6C, is in stark contrast to typical methods of laying down polycrystalline scintillation material, such as BaFCl(Eu), on a flat backing. The extrusion method of fabricating individual wavelength-shifting fibers coated with a uniform thickness of scintillator, as taught above, produces fibers that can be contoured so that the restrictions on the shape of a Sc-WSF detector is governed primarily by the requirement of full capture in the fiber by total internal reflection. The concept of uniformly coated coupling fibers gives greater freedom to the design of backscatter (BX) detectors, especially hand-held and robot-mounted detectors, where space is at a premium.

Deployable Detectors to Increase Geometric Efficiency of Scattered X-Rays

Some mobile x-ray systems, such as those described, for example, in U.S. Pat. No. 5,764,683, to Swift, et al. and U.S. Pat. No. 7,099,434, to Chalmers et al., both of which are incorporated herein by reference, use the method of backscattered x-rays (BX) to inspect cars and trucks from one side. The former uses detectors deployed outside a conveyance during operation, whereas the latter uses a detector area entirely contained within an enclosure, namely the skin of a conveyance. Both use large-area detectors to maximize the efficiency of detecting the scattered x-rays. The areal backscatter detector coverage in the case of a product in accordance with the teachings of the Chalmers '434 patent covers on the order of 20 square feet of the interior surface of an enclosure that faces the target. This covert detector area has relatively poor geometrical efficiency for collecting the scattered radiation from high or low targets. The intrinsically deep geometrical profile of such detectors, necessary for direct capture of the scintillation light by photomultipliers, is inimical to deployment outside the van.

Definitions:

As used herein, and in any appended claims, the term "large-area detector" shall refer to any single detector, or to any detector module, subtending an opening angle of at least 30° in each of two orthogonal transverse directions as viewed from a point on an object undergoing inspection, equivalently, characterized by a spatial angle of at least $\pi$ steradians.

A "conveyance" shall be any device characterized by a platform borne on ground-contacting members such as wheels, tracks, treads, skids, etc., used for transporting equipment from one location to another.

An Sc-WSF detector, in accordance with embodiments of the present invention, makes practical the unobtrusive storage of large-area detectors that can be quickly deployed outside the van in positions that substantially enhance detection efficiency.

Figure 9:
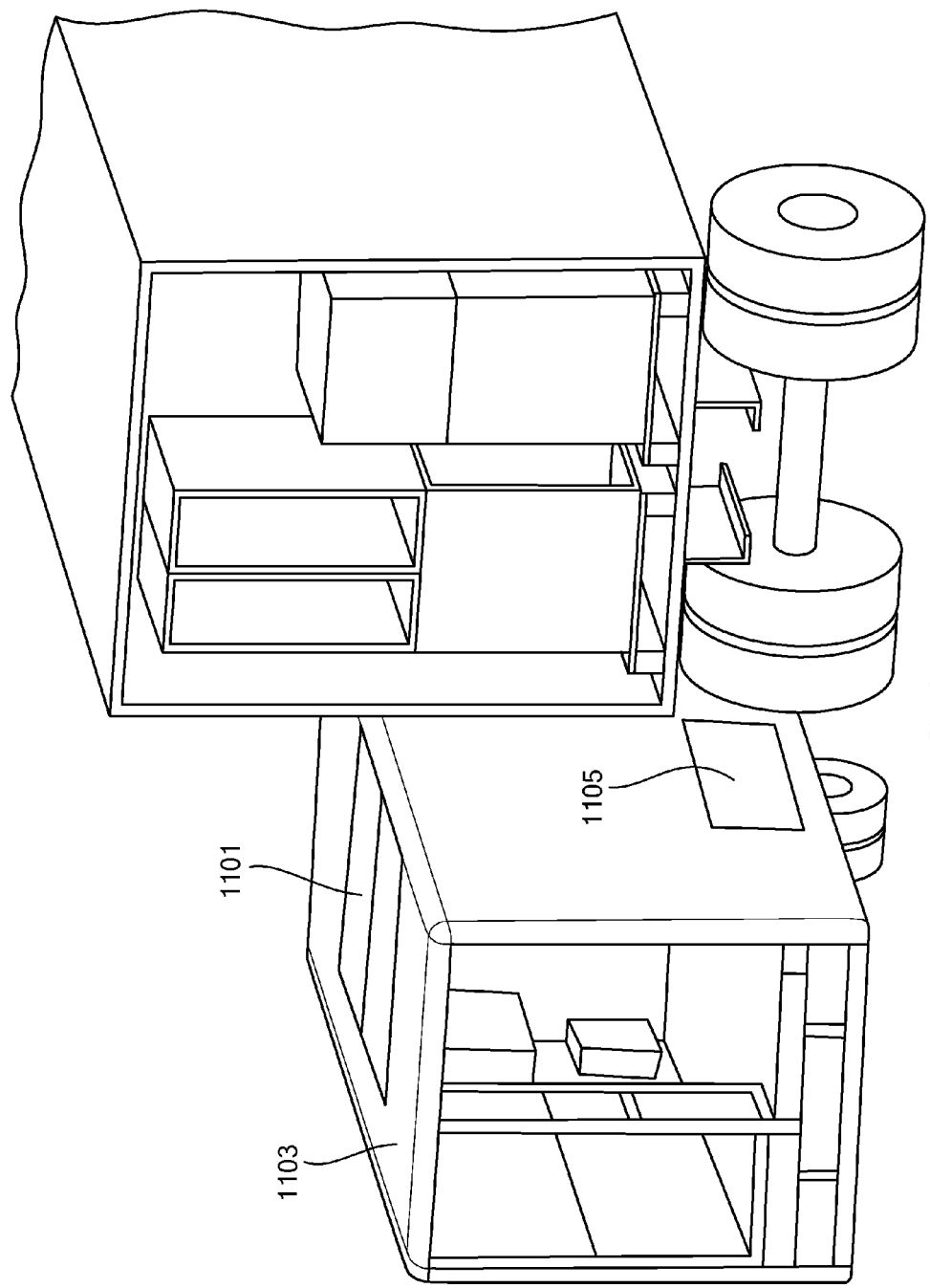
Figure 10:
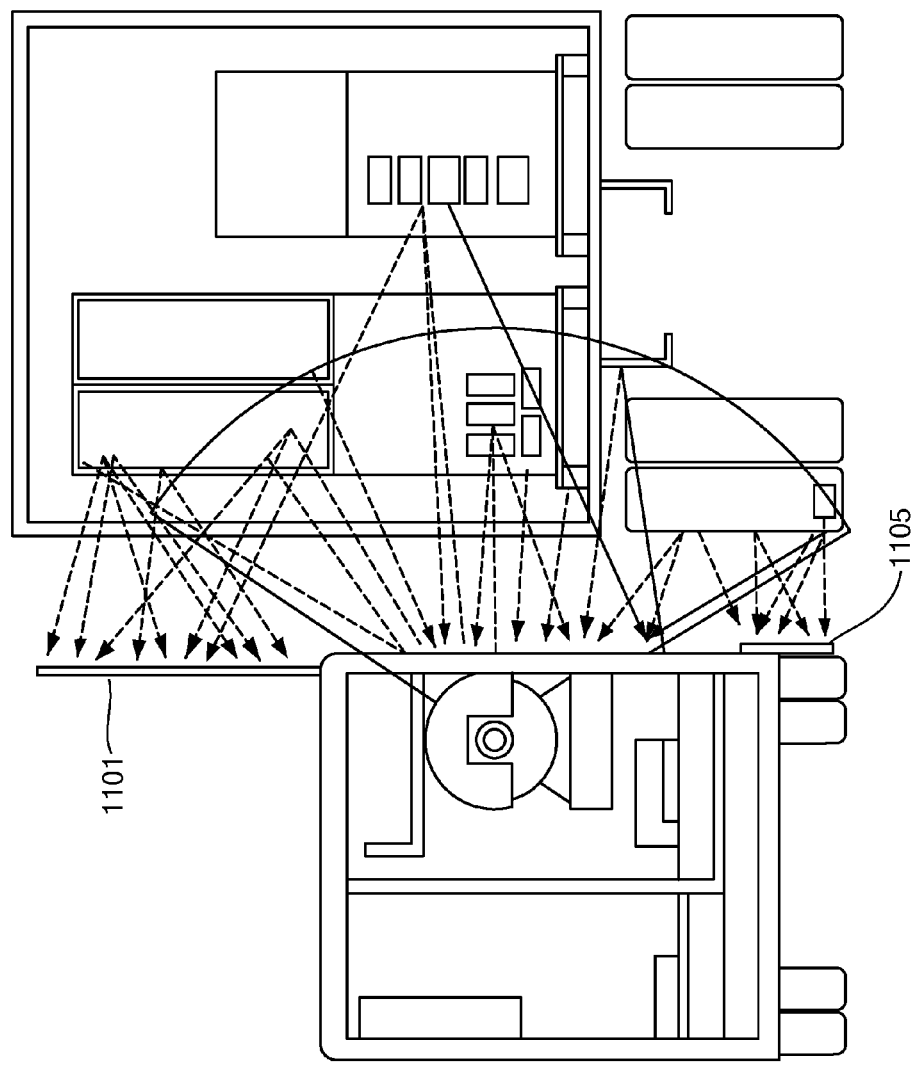
FIG. 10 shows the same detectors deployed during the course of inspection operations.
Figure 11:
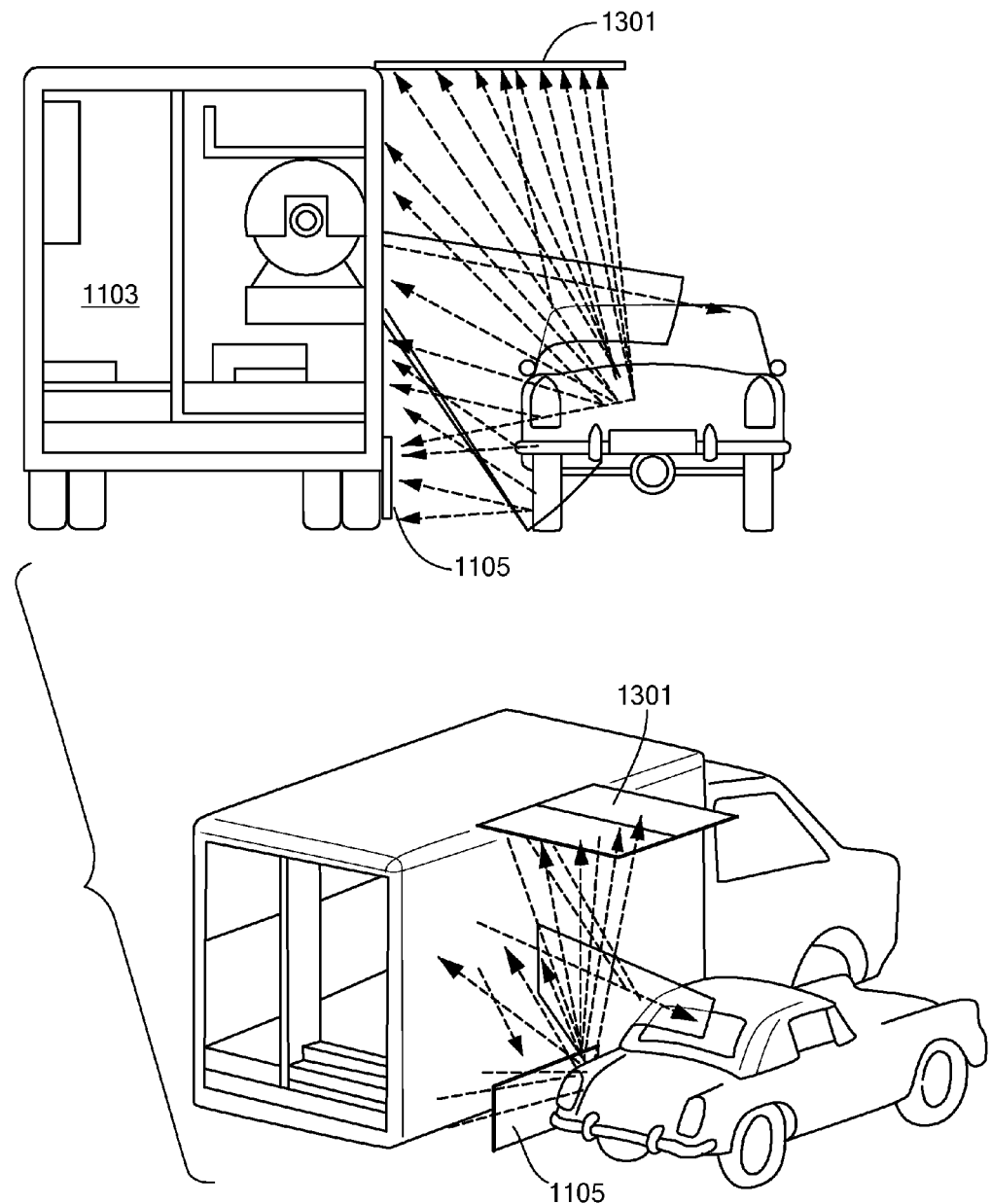
FIG. 11 shows an awning detector and a skirt detector for use with a backscatter inspection system in accordance with embodiments of the present invention.

Referring, now, to FIG. 9, a large-area Sc-WSF awning detector 1101 is shown in a stowed position, stored on the roof of a backscatter inspection van 1103, and a thin skirt detector 1105 is shown in a stowed position above a wheel of the backscatter inspection van. In FIG. 10, both the roof and skirt detectors are shown as deployed to increase the solid angle for detecting higher and lower targets, respectively; the awning detector is deployed above an inspected object during the course of inspection, while the skirt detector is deployed, at least in part, beneath the platform of the conveyance. In another embodiment of the invention, described with reference to FIG. 11, an awning detector 1301 may be deployed for low, close targets, such as for detection of contraband in the trunk or far side of a car 1303. Awning detector 1301 may slide out from a roof of the conveyance prior to inspection operation. FIG. 11 also shows the deployment of Sc-WSF skirt detectors 1105 used to efficiently examine the tires, wheel wells, and the interior of close vehicles.

Scanning pencil beams of x-rays not only reveal interior objects by analyzing the backscattered radiation but, in some applications, can obtain additional information by the simultaneous analysis of transmission (TX) and forward scattered (FX) radiation. The TX and FX detectors need not be segmented since the cross-sectional area of the pencil beam, together with the integration time of the signal, defines the pixel size. Moreover, the TX and FX detectors only need to be total energy detectors since, in most applications, the flux of the TX or FX x-rays is too high for pulse counting. Scintillation screens are the traditional detectors for such scanning beam applications. Sc-WSF detectors substantially extend the range of applications of present TX and FX scintillation detectors, as the following examples make clear.

TX for X-Ray Beams Up to at Least 250 keV

Figure 12:
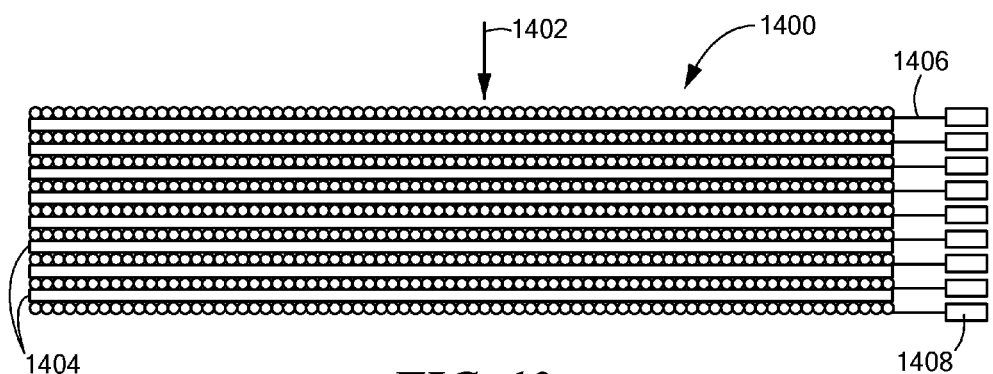
FIG. 12 is a cross-sectional schematic view of a stack of scintillator layers for use as a high-energy x-ray transmission detector, in accordance with an embodiment of the present invention.

The absorption efficiency of traditional scintillation screens, made, for example, of BaFCl(Eu) or Gadox, drops below 50% for x-ray energies above ~80 keV. The 50% point for two layers is about 100 keV. By way of distinction, Sc-WSF detector can be made with more than two layers of scintillators without substantially increasing the profile of the detector. A cost-effective Sc-WSF detector, with 4 layers, can be used for TX with scanning x-ray beams generated by a standard 140 keV x-ray tube. A multi-layer detector such as the 9-layer detector, as shown in FIG. 12, and designated there generally by numeral 1400, can be highly effective for a detecting x-rays 1402 emitted by a standard 225 keV x-ray tube (not shown), such as that used in the x-ray inspection of vehicles through portals. Layers 1404 of scintillator material are shown, and WSF fibers 1406 coupled to photo-detectors 1408.

Transportable TX Detector for Top-Down Imager in Three-Sided Portal Inspection

Figure 13A:
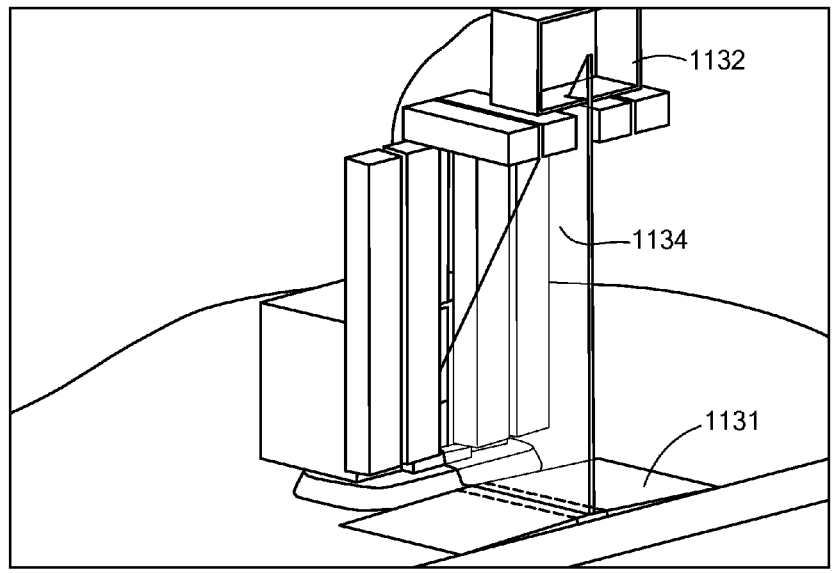
Figure 13B:
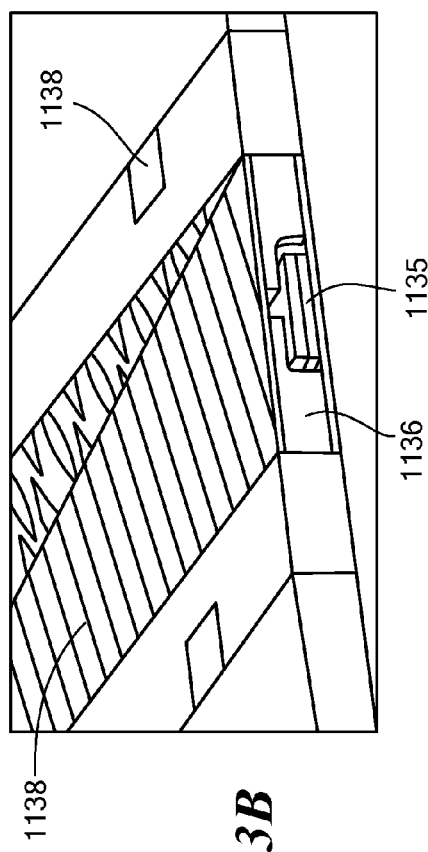
Figure 13C:
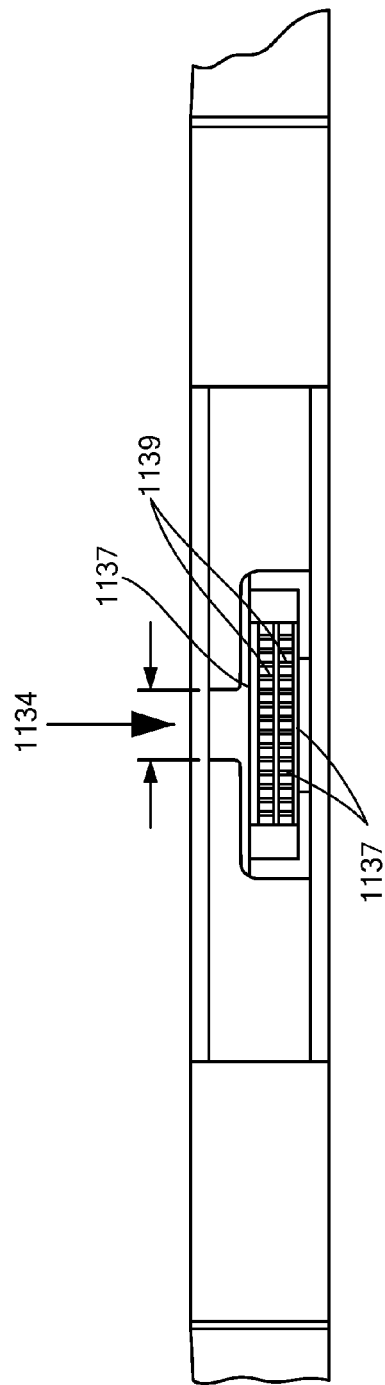
FIG. 13C shows a cross section of the detector assembly inserted into the speed bump frame.

The thin profile of the multi-layer transmission (TX) detector makes practical a top-of-the-road transmission (TX) detector. FIGS. 13A and 13B show such a detector inside a 2-inch-high speed bump 1131 strong enough to support a fully-loaded tractor trailer, and requiring no excavation of the ground for deployment. Source 1132 of penetrating radiation emits fan beam 1134 incident upon a linear detector assembly 1135 within frame 1136 of speed bump 1131 or a similar protrusion above an underlying surface. Detector assembly 1135 includes segments of scintillator material 1137 separated by vanes 1138 of high atomic number. As described above, for example with reference to FIG. 4, scintillation light is coupled to photo-detectors by means of wave-length shifting optical fibers 1139.

Segmented TX Detector for Determining the Scan Beam Intensity Profile

Referring now to FIGS. 14A and 14B, a segmented transmission detector, designated generally by numeral 1141, is shown for measuring a scan beam intensity profile of incident x-rays 1143. Alignment of the Sc-WSF detector 1141 (used in transmission) with the plane of a scanning pencil beam presents a significant challenge when the TX detector is deployed for a mobile security system. FIG. 14B shows a cross section of a vertical Sc-WSF detector 1141 (otherwise referred to herein, when appropriate, as a "transmission detector" or "TX detector") with independent readout of the fibers 1145 of the WSFs, provides the means to simultaneously measure both the transmitted intensity of each pixel and the linear distribution across the beam width to determine its centroid position. Fibers 1145 are routed in bundles 1147 to individual photo-detectors 1149 such as PMTs. The distribution of the intensity can extend out to obtain the forward scattered intensity, which contains useful information as to the scattering material, and gives a measure of the in-scattered radiation that is being counted as Transmission intensity.

The relative position of the detector plane and the plane of scanning x-rays can be controlled automatically. The detector for this concept is shown schematically in FIG. 14A. A reflecting surface 1148 may be provided at an end of detector 1141 distal to photo-detectors 1149.

With a single data channel for a transmission signal, the spatial resolution along the traffic direction (transverse to a fan-shaped illuminating x-ray beam) is determined by the smaller of the following two dimensions: the width of the sensitive detector area or the beam size across the TX detector. (For heuristic purposes, the case of undersampling is not considered in this description.) Spatial resolution may be improved, however, by narrowing the sensitive detector area, as now described with reference to FIG. 14C. In accordance with embodiments of the present invention, the spatial resolution across the direction of traffic (along the detector line) is enhanced by employing multiple detectors of a detector array 1450 associated with a plurality of channels (A, B, C, in FIG. 14C) and interlacing their sensitive areas. The pitch of the interlace pattern depends on the beam width along the detector. Ideally the pitch (i.e., the spacing between two detectors 1451 and 1454 associated with a single channel "A") has to be large enough so that two detector segments of the same detection channel do not receive direct radiation from the beam at the same time. The beam intensity profile is depicted by numeral 1456. For practical purposes the requirement is not as stringent, since some amount of crosstalk between pixels is acceptable. The multiple, resulting images need to be interlaced, employing any method, including methods well-known in the art, to create one higher-resolution image. It should be noted that improvement of the spatial resolution at the detector comes at the expense of flux and is, thus, limited by signal-to-noise considerations.

Another configuration within the scope of the present invention include a combination of the vertical detector 1141 shown in FIG. 14A with horizontal road detector 1135 of FIG. 13B to form an L-shaped detector that is advantageously easily set up and aligned.

In yet another embodiment of the invention, a transmission detector array 1450 (regardless of geometrical orientation, whether vertical, horizontal, L-shaped, etc.) is segmented into a plurality of units; such as B, C and A of FIG. 14C. As shown, the beam profile 1456 is symmetric with respect to B and A so that the ratio of the measured intensities is unity. If, for any reason, the alignment changes, that ratio changes dramatically. If the alignment skews as an illuminating x-ray pencil beam scans up and down, the change in the ratio of B/A measures the both the skewness and the lateral shift. Collected data can then be corrected for such a shift on a line-by-line basis.

Dual-Energy and Multi-Energy TX Detectors for Material Identification

Separating the signals from front and back layers of scintillators allows the front layer to give a measure of the low-energy component of each pixel while the back layer gives a measure of the high-energy components. Putting a layer of absorbing material between the front and back scintillators is a standard way to enhance the difference between low and high energy components, and that is easily done with a Sc-WSF detector.

The Sc-WSF detector makes practical a dual-energy detector consisting of a layer of Sc-WSF, such as BaFCl-WSF, on top of a plastic scintillator detector; the BaFCl is sensitive to the low-energy x-rays and not the high-energy x-rays, while the plastic detector is sensitive to the high-energy x-rays and very insensitive to low energy x-rays.

An alternative and potentially more effective material discriminator can be made by using more than two independent layers of Sc-WSF, with separate readouts for each layer. A passive absorber, such as an appropriate thickness of copper, can be inserted after the top Sc-WSF to enhance dual energy application, as is practiced with segmented detectors. Alternatively, the middle scintillator can be used as an active absorbing layer. The measurement of three independent parameters allows one to get a measure of both the average atomic number of the traversed materials and the extent of beam hardening as well. The Sc-WSF can be further extended to obtain more than three energy values for each pixel, the limit being the statistical uncertainties, which increase with the number of components. Detector 1400 shown in FIG. 12 is an extreme example of such a detector.

Figure 15:
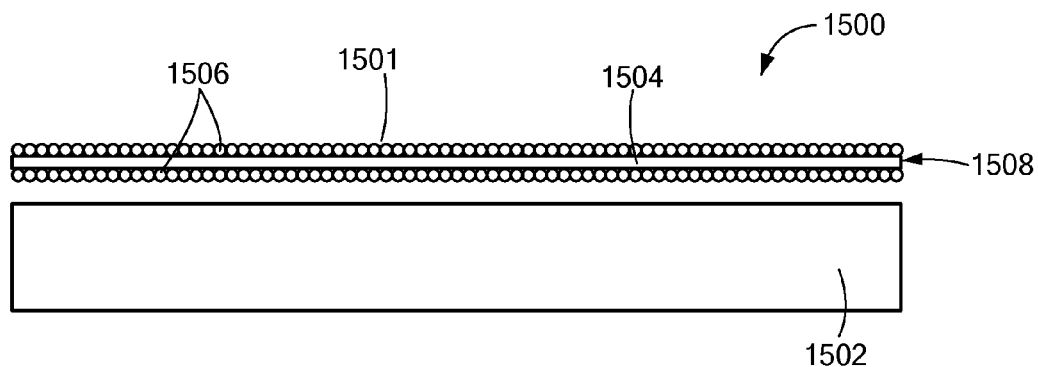
FIG. 15 is a cross-sectional view of a scintillation detector with multi-energy resolution, in accordance with an embodiment of the present invention.

An important application of Dual-Energy TX is for x-ray personnel scanners at airport terminals. Providing TX images simultaneously with BX has proved useful for inspection. Adding dual-energy to the TX images has hitherto been impractical primarily because of size constraints imposed by conventional detectors. Sc-WSF eliminates those constraints and promises to significantly improve performance, since multiple detectors, with distinct energy sensitivities, may be stacked, as shown in FIG. 15, where a dual- (or multi-) energy detector 1500 includes an Sc-WSF detector 1508, sensitive to a lower energy component of incident x-rays 1501, positioned in front of a slab of plastic scintillator 1502, which is sensitive to the higher energy x-rays. Sc-WSF detector 1508 contains a scintillator 1504 read out by two layers of WS fibers 1506.

Compact Radiation Detector of Gamma and Neutron Radiation

Figure 16:
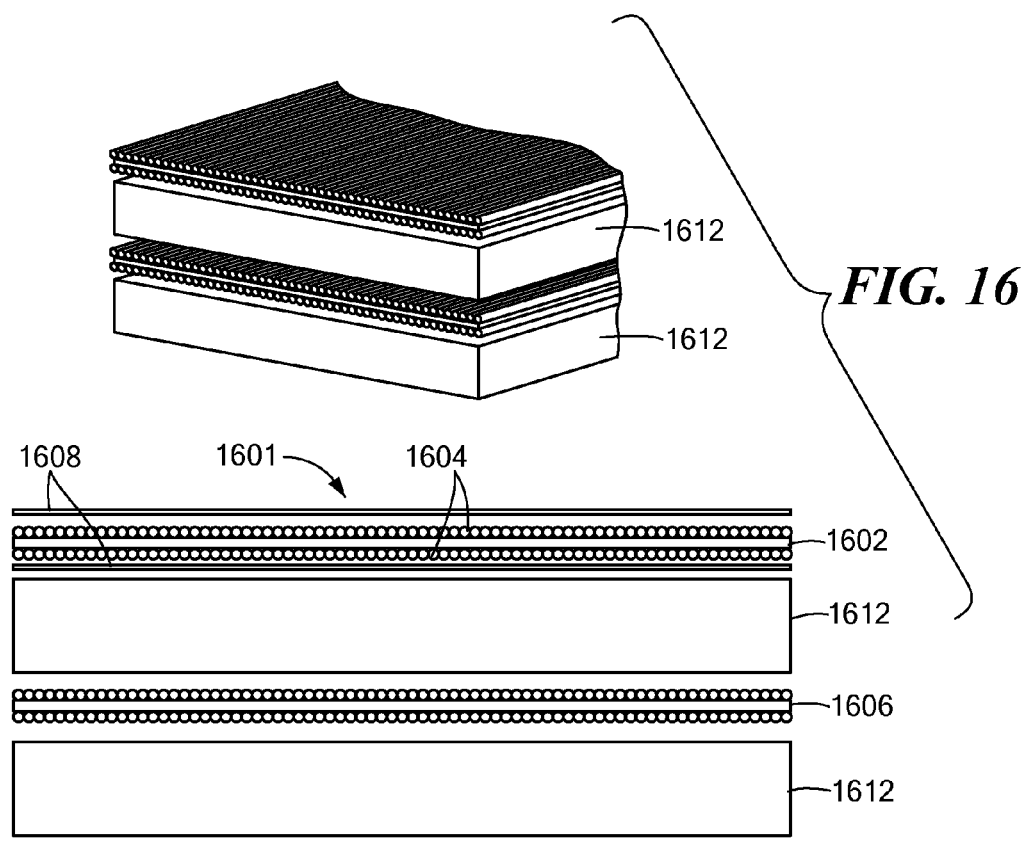
FIG. 16 shows a multi-layer scintillation detector for detection of both x-rays and thermal neutrons, in accordance with an embodiment of the present invention.

The Sc-WSF method makes practical a small, lightweight, inexpensive, monitor of neutrons and gamma rays 1601. BaFCl(Eu)-WSF is quite sensitive to gamma radiation while being insensitive to neutrons, while $Li^6F:ZnS(Ag)$-WSF is insensitive to gamma rays and quite sensitive to detecting thermal neutrons. FIG. 16 shows a multi-layer "Dagwood" sandwich consisting of one or more layers 1602 of BaFCl (Eu), read out by a single photo-detector (not shown) via optical fibers 1604, and one or more layers 1606 of $Li^6F$:ZnS(Ag)-WSF, read out by a second, independent, photo-detector (not shown), with the active elements occupying a thickness of no more than one or two centimeters. An appropriate layer of neutron moderator 1612, such as polyethylene, may be placed on either side of the $Li^6F$:ZnS(Ag)-WSF to enhance the efficiency for detecting neutrons. Optically reflective foil 1608, such as aluminum foil, confines scintillation to respective detector regions.

Figure 17:
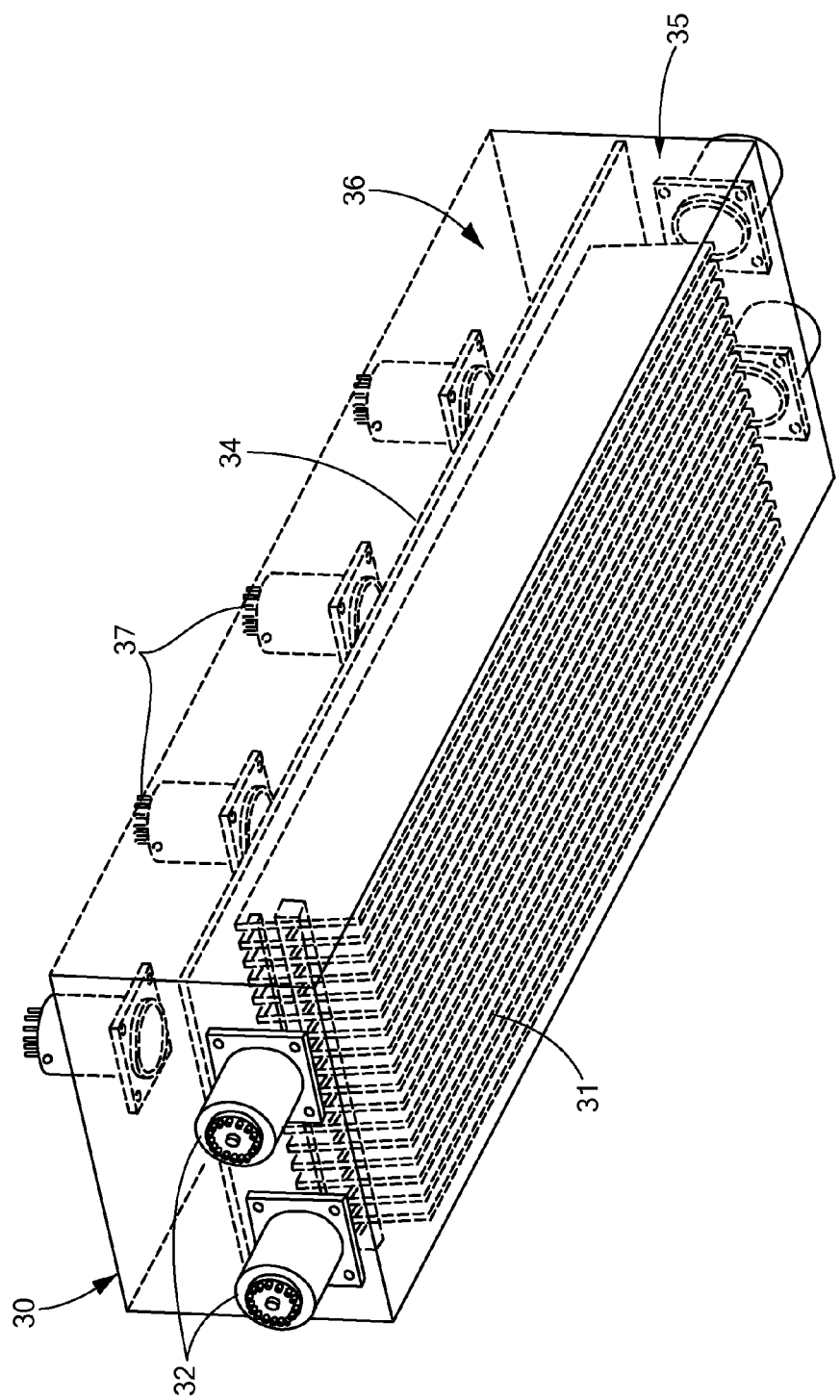
FIG. 17 shows a perspective view of a detector with active collimators.

U.S. patent application Ser. No. 13/163,854 (to Rothschild), entitled "Detector with Active Collimators," and incorporated herein by reference, describes a backscatter detector module 30 that increases the depth of inspection by distinguishing scatter from the near and far field of inspected objects, as depicted in FIG. 17. The angle of a set of active collimating vanes 31 may either be adjusted once at the factory, or may be attached to any kind of electro-mechanical device provided to dynamically adjust them, depending on the type and/or distance of the object being scanned. The scintillation light from the collimating vanes is detected by one or more photo-detectors (for example, by PMTs 32 located at the top and bottom of the front compartment of the detector). A rear compartment 36 of the detector is optically isolated from a front compartment 35 by a light baffle 34, and scintillation light from x-rays detected in rear compartment 36 are collected by a second set of one or more photo-detectors (for example, PMTs 37 mounted on the rear face of the detector. The rear compartment may be lined with scintillating phosphor screen, for example, or, in other embodiments of the invention, may contain plastic or liquid scintillator.

A useful addition to a standard backscatter unit would be a "venetian blind" collimator made of scintillator. The slats intercept radiation that does not enter directly through the gaps between the slats so that the box detectors preferentially detect deeper interior objects. The active collimators record the rejected radiation. The light from the active collimators is detected by PMTs, whose collection efficiency decreases rapidly as the gap between collimators decrease. Replacing the PMTs and scintillator vanes with vanes consisting of Sc-WSF detectors solves major shortcomings and makes venetian-blind collimators practical. First, light collection is independent of the gap width between vanes. Second, the active area of the PMTs or silicon photomultipiers used to collect the light from the active collimators is generally much smaller than the active area of needed PMTs, so that the cost of the photo-detectors is less. Third, the placement of the photo-detector at the end of the WSF bundles is not critical to the efficiency of the light collection. Fourth, the signals from the WSFs from each slat can be processed independently, giving considerable scope for maximizing the information about the interior of the inspected object. Fifth, the light from the thin scintillator screens on the front and back of each vane can be collected by independent WSFs, which can significantly improve the depth discrimination.

Figure 18A:
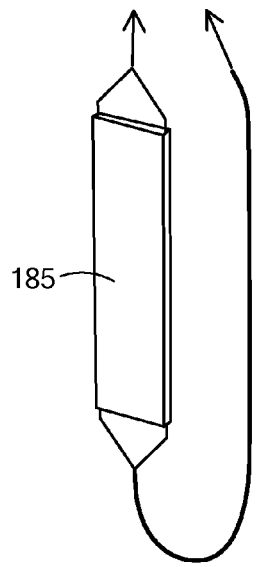
FIGS. 18A and 18B show perspective and cross-sectional views of a WSF-detector used as an active collimator in accordance with an embodiment of the present invention.
Figure 18B:
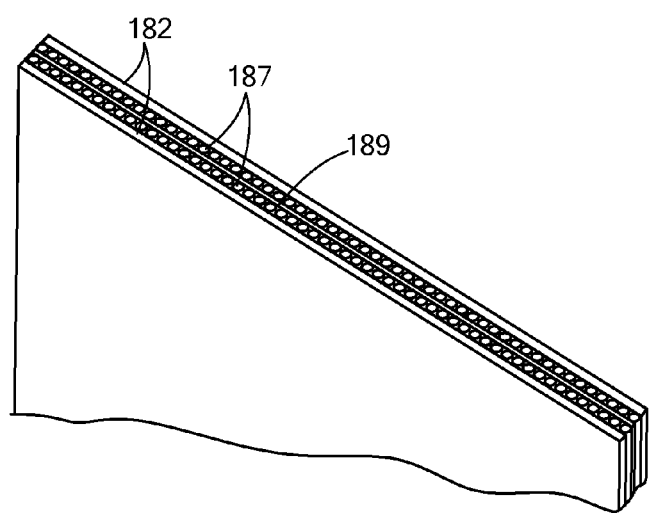
Figure 18C:
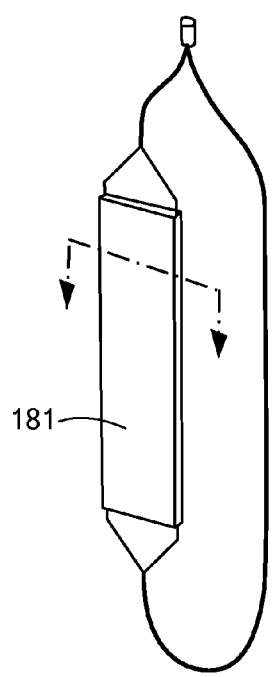
FIGS. 18C and 18D show an arrangement with independent readouts separated by a light-tight x-ray absorber to distinguish radiation striking each face, in accordance with a further embodiment of the present invention.
Figure 18D:
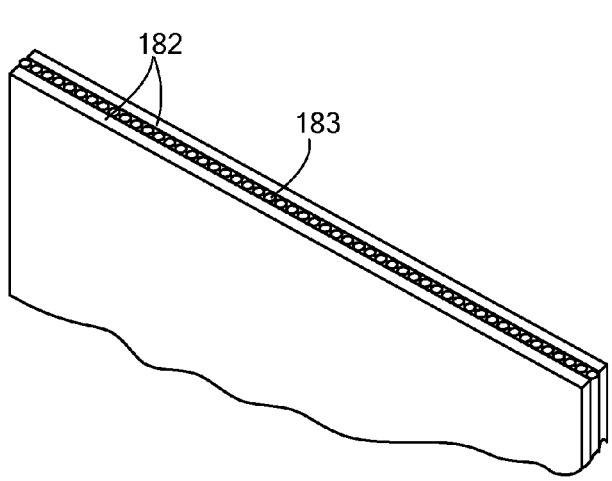

FIGS. 18C and 18D depict (in perspective and in cross section, respectively) an active WSF collimator 181 sensitive to x-rays impinging from either side of the scintillator. Scintillation light from both scintillator regions 182 is coupled to photo-detectors via waveshifting optical fibers 183. FIGS. 18A and 18B show (in perspective and in cross section, respectively) an active WSF collimator 185 with independent readouts 187 separated by a light-tight x-ray absorber 189 to distinguish radiation striking each face. For example, each collimator 185 may consist, in one embodiment, of two layers of Sc-WSF detectors 182, each containing an areal density of 60 mg BaFCl:Eu per cm2. The light-tight x-ray absorber 189 may consist of a thin layer of tin, which also provides structural support.

Detectors for Mini-Backscatter Inspection Systems

Figure 19B:
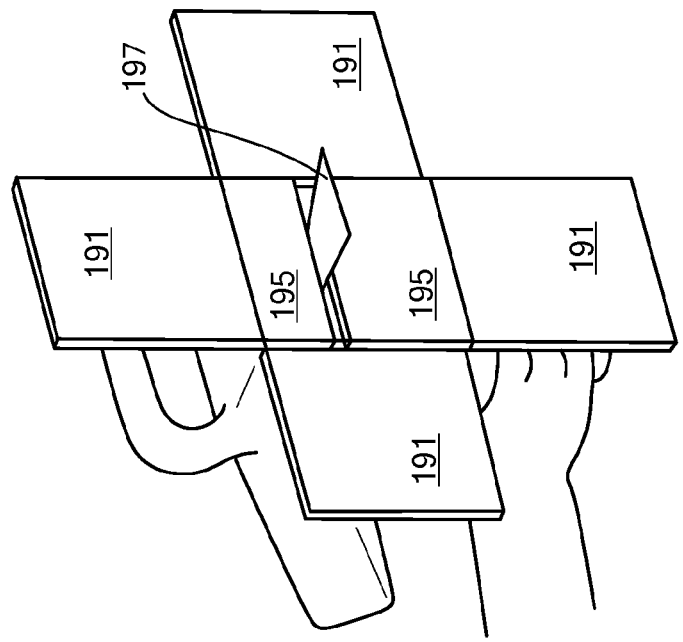
FIGS. 19A and 19B shows multiple detectors folding out of a hand-held scanner, in stored and deployed conditions, respectively, in accordance with an embodiment of the present invention.
Figure 19A:
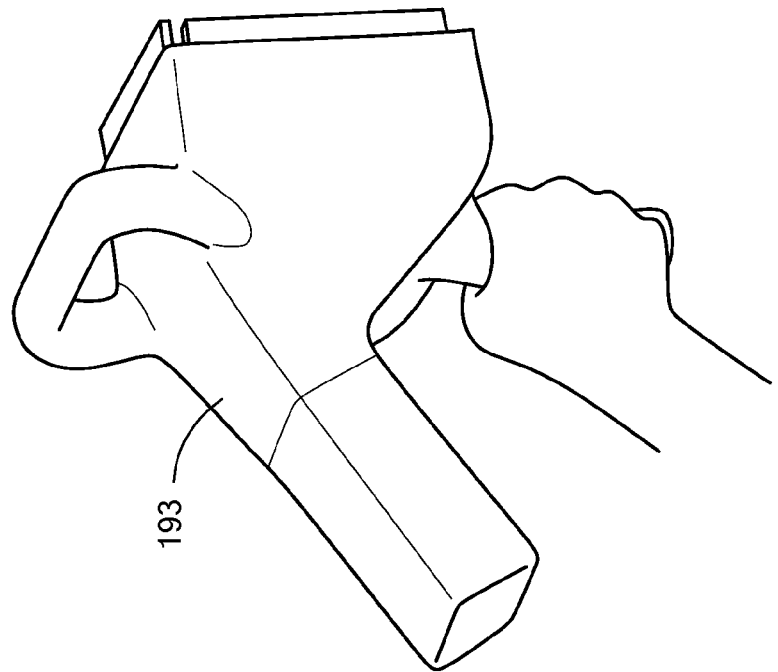

The thinness of Sc-WSF detectors provides a unique potential for applications in which low weight and power are drivers. Referring to FIGS. 19A and 19B, a hand-held imaging system 193 is an example of such an application. The power requirements, inspection time, and, quality of the image, are all affected by the solid angle of detection. A traditional detector with, for example, a cross-section of 10 cm×10 cm (100 cm²), weighs about a half a kilogram. A 10-cm cube of Sc-WSF, weighing no more than twice as much, can be made of individual Sc-WSF 10 cm×10 cm detectors, each less than 5 mm thick, that can be unfolded to present a backscatter detection area of at least 2,000 cm², a twenty-fold increase in this example. The additional detection coverage can make an order of magnitude improvement in the hand-held system's performance.

The thin profile of Sc-WSF detectors described herein provide for fitting contoured detectors into tight spaces. For example, detectors may be adapted for personnel scanners constrained to fit into constricted airport inspection spaces.

FIG. 19 shows an example in which four detectors 191 fold or slide out of hand-held scanner 193 to substantially increase the detection efficiency, especially for items concealed deeper in the object being inspected. Backscatter detectors 195 straddle irradiating beam 197.

Back-Scatter Inspection of the Underside of Stationary Vehicles

The inspection of the underside of vehicles by a portable x-ray backscattering system presents special problems. The road clearance of cars is not more than 8" and can be as little as 6". Fixed inspection systems, such as portals, can place a detector in the ground, or, as described above, can be placed on the ground using Sc-WSF. Mobile under-vehicle inspection systems, however, which are needed for security in many areas, have never been developed. Inspectors rely on passive inspection tools such as mirrors and cameras, which miss contraband in the gas tank or are camouflaged to appear innocuous.

Figure 20A:
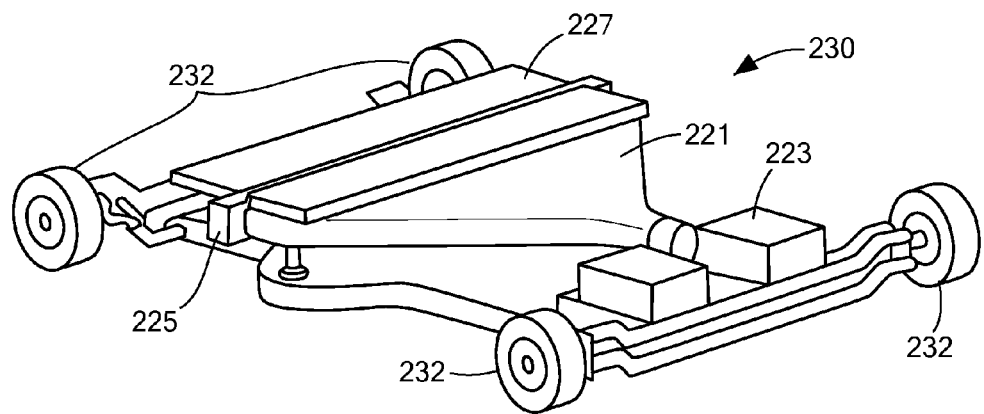
FIGS. 20A and 20B show a backscatter unit that, by virtue of Sc-WSF detectors in accordance with the present invention, may be slid under a vehicle for under-chassis inspection.
Figure 20B:
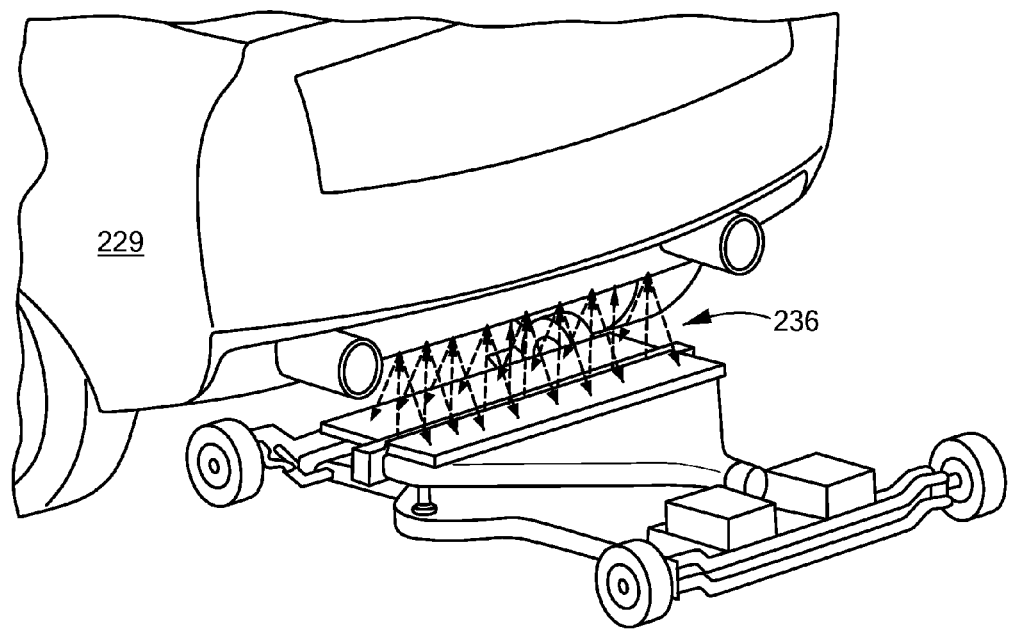

The Sc-WSF detectors make practical an x-ray backscatter system that is not more than 6" high. A sketch of a practical system is now described with reference to FIGS. 20A and 20B. The x-ray source consists of an electromagnetic scanner 221 of an electron beam across an anode. Electromagnetic scanner 221 is driven by electronics module 223. The x-rays are collimated by a linear array of apertures 225 that span, for example, 30" of the underside in one pass. The Sc-WSF detectors 227 are mounted on each side of the x-ray tube so as detect x-rays 236 backscattered from vehicle 229. Power supplies, pulse and image processors can be mounted appropriately. Chassis 234 of inspection unit 230 on wheels 232 may be adapted to be maneuvered under vehicle 229 by motor or manual control.

Mobile Transmission Inspection with L-Shaped Detector Array Segments

Figure 21A:
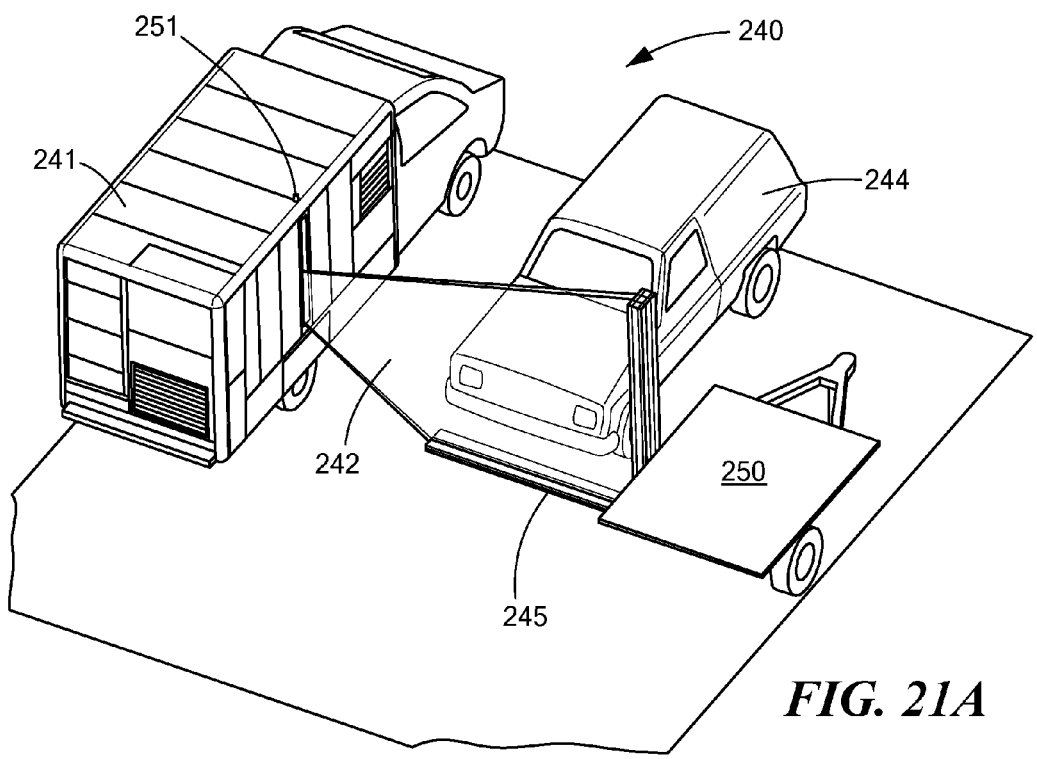
FIGS. 21A and 21B depict the use of a right-angled combination of detectors based on Sc-WSF technology in conjunction with a mobile inspection system and in accordance with an embodiment of the present invention.
Figure 21B:
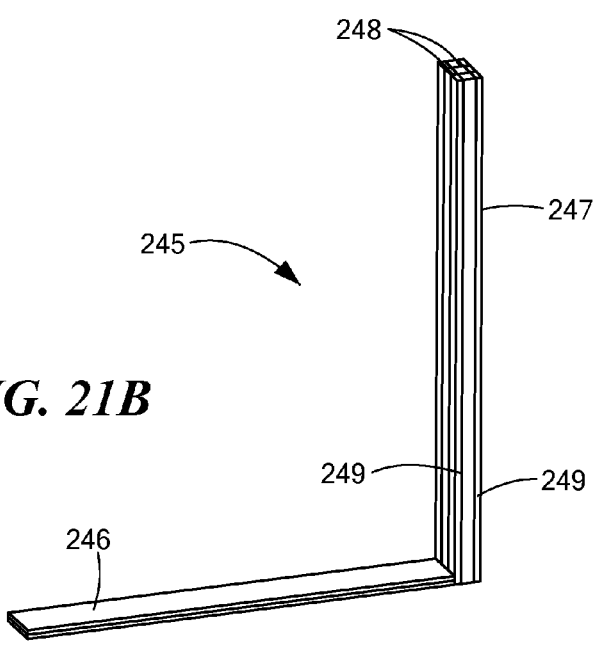

In accordance with another aspect of the present invention, a mobile inspection system, designated generally by numeral 240, is now described with reference to FIGS. 21A and 21B. A source of penetrating radiation (not shown, and described, herein, without limitation, in terms of x-rays) is conveyed within a mobile inspection unit 241, which, typically, is capable of motion under its own power, although it may also be towed or otherwise transported, within the scope of the present invention. A beam 242 of penetrating radiation is emitted from mobile inspection unit 241, either as a swept pencil beam or as a fan beam, in either case emitted in the plane designated as representing beam 242 in FIG. 21A. Inspected object 244, which may be a vehicle as shown, or otherwise (such as hauled cargo), traverses beam 242 during the course of inspection, and, in the course of traversal, passes over an integral L-shaped detector unit 245, as now further described. Detector unit 245 has a horizontal segment 246 and an upright segment 247, as indicated in FIG. 21B.

Each of the horizontal and upright segments 246 and 247 of L-shaped detector unit 245 may be comprised of multiple parallel layers 249, providing for dual- or, more generally, multiple-, energy resolution of detected x-rays, so as to provide material identification, as described above with reference to FIG. 12. Additionally, upright detector array segment 247 may have multiple detector segments 248 in a direction transverse to the direction of beam 242 and substantially along the direction of relative motion between inspected object 244 and beam 242 so as to provide an indication of skewness or lateral shift of the detectors with respect to the beam, as described above with reference to FIGS. 14A-14C. Integral L-shaped detector unit 245 may be conveyed to a site of inspection aboard mobile inspection unit 241 or on a towed, or otherwise accompanying, trailer 250, and may be assembled, in part, upon deployment at the inspection site. Supplemental alignment aids, such as alignment laser 251, may be employed in establishing proper position and orientation of detector unit 245 relative to mobile inspection unit 241 and beam 242.

Where examples presented herein involve specific combinations of method acts or system elements, it should be understood that those acts and those elements may be combined in other ways to accomplish the same objectives of x-ray detection. Additionally, single device features may fulfill the requirements of separately recited elements of a claim. The embodiments of the invention described herein are intended to be merely exemplary; variations and modifications will be apparent to those skilled in the art. All such variations and modifications are intended to be within the scope of the present invention as defined in any appended claims.

What is claimed is:

1. A method for discriminating among x-ray beams of distinct energy content, the method comprising:
    a. converting energy of an x-ray beam incident upon a first volume of scintillation medium into a first scintillation light;
    b. guiding light derived from, and at a first wavelength longer than the first scintillation light via a first plurality of wavelength-shifting optical waveguides;
    c. converting energy of x-ray radiation that has traversed the first volume into a second scintillation light in a second volume of scintillation medium, wherein the second volume of scintillation medium is a different volume from the first volume of scintillation medium;
    d. detecting, with a first photodetector, photons at the first wavelength guided by the first plurality of waveguides thereby generating a first detector signal; and
    e. detecting, with a second photodetector, photons due to scintillation in the second volume of scintillator material thereby generating a second signal;
    f. processing the first signal and the second signal to provide a measure of a low energy component and a high-energy component of the x-ray beam incident upon the first volume of scintillation material.

2. A method according to claim 1, further comprising guiding light derived from, and at a second wavelength longer than that of, the second scintillation light via a second plurality of wavelength-shifting optical waveguides to the second photodetector.

3. A method according to claim 1, wherein the first volume of scintillation medium and the second volume of scintillation medium are characterized by distinct spectral sensitivities to an x-ray beam traversing both the first and second volumes of scintillation medium.

4. A method according to claim 1, wherein the second volume of scintillation medium is characterized by a higher sensitivity to photons exceeding a specified energy that the first volume of scintillation medium.

5. A method according to claim 1, wherein the second volume of scintillator medium includes plastic scintillator.

6. A method according to claim 1, wherein the first volume of scintillator medium includes a lanthanide-doped barium mixed-halide.

7. A method according to claim 1, further comprising:
g. collecting light produced by scintillation in a third volume of scintillation medium traversed by the incident x-ray beam after transversal of the first volume of scintillation medium and before incidence upon the second volume of scintillation medium;
h. coupling the light produced by scintillation in the third volume into coupled light within a waveguide;
i. converting the light within the waveguide to a light of longer wavelength than the coupled light; and
j. detecting the light of the longer wavelength and producing a third signal for processing in conjunction with the first and second signals.

8. A method according to claim 1, further comprising enhancing a difference between low- and high-energy components of the incident x-ray beam by absorbing energy from the incident x-ray beam after transversal of the first volume of scintillation medium and before incidence upon the second volume of scintillation medium.

9. A method according to claim 5, wherein absorbing energy from the incident x-ray beam after transversal of the first volume of scintillation material includes traversal, by the beam, of copper intervening between the first volume of scintillation medium and the second volume of scintillation medium.

10. A method according to claim 1, further comprising measuring an average atomic number of material traversed by an x-ray beam on the basis of the measure of the low energy component and the high-energy component of the x-ray beam incident upon the first volume of scintillation medium.

* * * * *